(12) United States Patent
Ge et al.

(10) Patent No.: US 10,560,218 B2
(45) Date of Patent: Feb. 11, 2020

(54) APPARATUS AND METHODS FOR DECODING ASSISTANT BIT-BASED POLAR CODE CONSTRUCTION

(71) Applicant: HUAWEI TECHNOLOGIES CO., LTD., Shenzhen, Guangdong (CN)

(72) Inventors: Yiqun Ge, Kanata (CA); Hamid Saber, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 18 days.

(21) Appl. No.: 15/852,537

(22) Filed: Dec. 22, 2017

(65) Prior Publication Data

US 2018/0191459 A1    Jul. 5, 2018

Related U.S. Application Data

(60) Provisional application No. 62/442,654, filed on Jan. 5, 2017.

(51) Int. Cl.
*H04L 1/00* (2006.01)
*H03M 13/13* (2006.01)

(52) U.S. Cl.
CPC .......... *H04L 1/0013* (2013.01); *H03M 13/13* (2013.01); *H04L 1/0041* (2013.01); *H04L 1/0045* (2013.01); *H04L 1/0052* (2013.01); *H04L 1/0054* (2013.01); *H04L 1/0061* (2013.01); *H04L 1/0063* (2013.01); *H04L 1/0068* (2013.01)

(58) Field of Classification Search
CPC .. H03M 13/09; H03M 13/13; H03M 13/2906; H03M 13/635; H03M 13/6362; H04L 1/0009; H04L 1/0013; H04L 1/0041; H04L 1/0045; H04L 1/0052; H04L 1/0054; H04L 1/0061; H04L 1/0063; H04L 1/0068

See application file for complete search history.

(56) References Cited

U.S. PATENT DOCUMENTS

| 2003/0128674 A1* | 7/2003 | Kong ............... H04B 7/264 370/320 |
| 2006/0212774 A1* | 9/2006 | Lee ............... H03M 13/25 714/755 |
| 2015/0256196 A1 | 9/2015 | Alhussien et al. |
| 2016/0241355 A1 | 8/2016 | Mahdavifar et al. |

(Continued)

OTHER PUBLICATIONS

3GPP TSG-RAN WG1 #85 R1-164699, "Polar code design overview", Qualcomm Incorporated, May 23-27, 2016, total 3 pages.

(Continued)

*Primary Examiner* — Mewale A Ambaye

(57) ABSTRACT

An assistant sub-channel to carry a decoding assistant bit, in input bits that are to be encoded, is selected from each of a plurality of non-adjacent segments. Each segment includes a subset of sub-channels with associated reliabilities. Some embodiments also involve grouping the sub-channels into the segments. After a target number of assistant sub-channels have been selected, the input bits are encoded to generate a codeword, and the codeword is transmitted. Assistant sub-channel selection could involve iterations to select assistant sub-channels at each iteration, until at least the target number of assistant sub-channels have been selected.

25 Claims, 15 Drawing Sheets

(56) References Cited

U.S. PATENT DOCUMENTS

| | | | |
|---|---|---|---|
| 2016/0261374 A1* | 9/2016 | Kim | H03M 13/1157 |
| 2017/0353271 A1* | 12/2017 | Kudekar | H04L 1/0057 |
| 2018/0048426 A1* | 2/2018 | Yang | H03M 13/1102 |

OTHER PUBLICATIONS

Ido Tal et al.,"How to Construct Polar Codes", IEEE Transactions on Information Theory, vol. 59, No. 10, Oct. 2013, total 21 pages.

Mattias Andersson et al., "Polar Coding for Bidirectional Broadcast Channels with Common and Confidential Messages", IEEE Journal on Selected Areas in Communications, vol. 31, No. 9, Sep. 2013, total 8 pages.

E. Arikan, "Channel polarization: A method for constructing capacity-achieving codes for symmetric binary-input memoryless channels," IEEE Transactions on Information Theory, vol. 55, No. 7, 2009, pp. 3051-3073.

Tal and Vardy, "List Decoding of Polar Codes", Proceedings of the 2011 IEEE International Symposium on Information Theory, Jul. 2011, 11 pages.

R. Pedarsani, "Polar Codes: Construction and Performance Analysis", Jun. 2011, EPFL master project, 48 pages.

Mori R, Tanaka T., "Performance and construction of polar codes on symmetric binary-input memoryless channels", IEEE International Symposium on Information Theory, 2009, pp. 1496-1500.

J.Dai, K.Niu, Z.Si, J.Lin, "Evaluation and Optimization of Gaussian Approximation for Polar Codes", May 2016, 4 pages.

P. Trifonov, "Efficient design and decoding of polar codes." IEEE Transactions on Communications 60.11 (2012): pp. 3221-3227.

R1-1611254, "Details of the Polar Code Design", Huawei & HiSilicon, 3GPP TSG RAN WG1 Meeting #87, 33 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$100$ $$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$102$ $$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

Length $N=2^m$, $m \in \mathbb{N}$
Generator matrix: Columns of $G_2^{\otimes m}$ $$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

104

200 → $x = [0\ 0\ 0\ u_3\ 0\ u_5\ u_6\ u_7] G_2^{\otimes 3}$

| | |
|---|---|
| Frozen-bit | $u_0$ — $x_0$ encoded-bit |
| Frozen-bit | $u_1$ — $x_1$ encoded-bit |
| Frozen-bit | $u_2$ — $x_2$ encoded-bit |
| Info-bit | $u_3$ — $x_3$ encoded-bit |
| Frozen-bit | $u_4$ — $x_4$ encoded-bit |
| Info-bit | $u_5$ — $x_5$ encoded-bit |
| Info-bit | $u_6$ — $x_6$ encoded-bit |
| Info-bit | $u_7$ — $x_7$ encoded-bit |

Successive Cancellation Decoding for $i = 0, 1, \ldots, n-1$ do
$\quad$ if $\widehat{u}_i$ *is frozen* then set $\widehat{u}_i$ accordingly;
$\quad$ else
$\quad\quad$ if $W_i(\mathbf{y}_0^{n-1}, \widehat{u}_0^{i-1}|0) > W_i(\mathbf{y}_0^{n-1}, \widehat{u}_0^{i-1}|1)$ then
$\quad\quad\quad$ set $\widehat{u}_i \leftarrow 0$;
$\quad\quad$ else
$\quad\quad\quad$ set $\widehat{u}_i \leftarrow 1$;

$F = \{0, 1, 2, 4\}$

From 0 till $N-1$ $\quad$ if $i \in F, \widehat{u}_i = 0$ $\quad$ if $i \in F^c$, $$\widehat{u}_i = \begin{cases} 0, & \text{if } \dfrac{P(0 | \widehat{u}_0^{i-1}, \bar{y})}{P(1 | \widehat{u}_0^{i-1}, \bar{y})} > 1 \\ 1, & \text{otherwise} \end{cases}$$

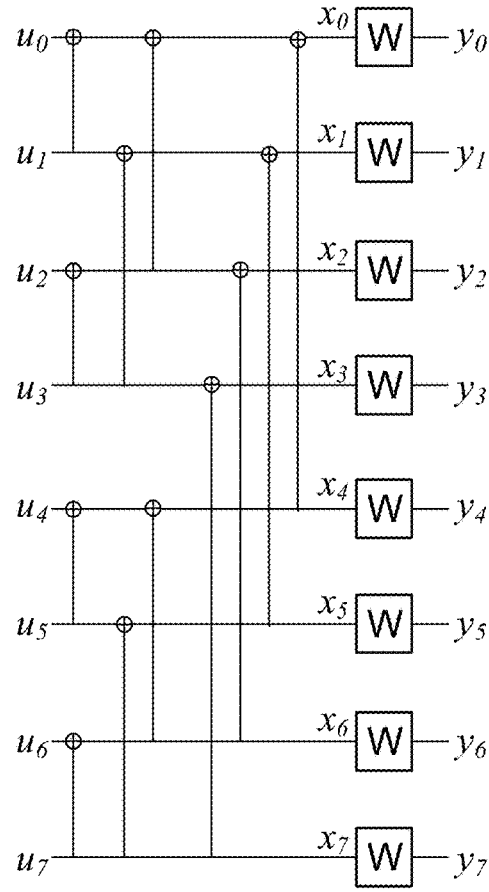

FIG. 3

Pre-Computed Reliability Location Sequence
{ 0 1 2 4 8 3 5 6 9 10 12 7 11 13 14 15 }
Encoder Example: (N=16, K=6, R=½)
Bit-reversal
○ Data bit
◔ Frozen bit
○ Puncture bit
FIG. 8

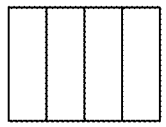
L = 4, divide into 4 segments
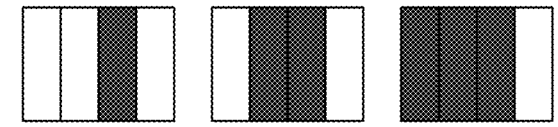
$Q_4 = \{0\ 1\ 2\ 3\}$
Find two Assistant Sub-channels in Segment 2 and 4 based Q4
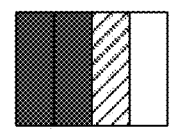
L = 2, merge into 2 segments
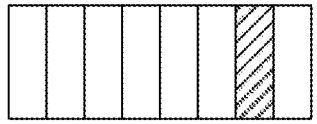
$Q_8 = \{0\ 1\ 2\ 4\ 3\ 5\ 6\ 7\}$
Find one Assistant Sub-channels in Segment 2 based on Q8
Because there's no information sub-channels before the 1st found assistant one, turn it to frozen
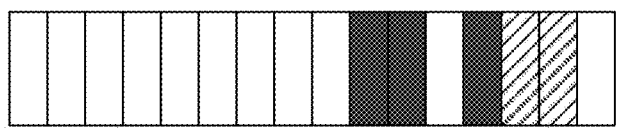
FIG. 9

APPARATUS AND METHODS FOR DECODING ASSISTANT BIT-BASED POLAR CODE CONSTRUCTION

CROSS-REFERENCE TO RELATED APPLICATIONS

The present application claims the benefit of U.S. Provisional Application No. 62/442,654, filed on Jan. 5, 2017, entitled "APPARATUS AND METHODS FOR DECODING ASSISTANT BIT-BASED POLAR CODE CONSTRUCTION", the entire contents of which are incorporated herein by reference.

FIELD

The present disclosure relates to generally to communications and, in particular, to construction of polar codes with decoding-assistant bits.

BACKGROUND

Polar codes are proposed as channel codes for use in future wireless communications, and have been selected for uplink and downlink enhanced Mobile Broadband (eMBB) control channel coding for the new $5^{th}$ Generation (5G) air interface, also known as the new 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation List (SCL) decoding and its extensions (e.g., SC List decoding) are effective and efficient options for decoding polar coded information.

Based on channel polarization, Arikan designed a channel code that is proven to reach channel capacity. Polarization refers to a coding property that, as code length increases to infinity, bit-channels which are also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect bit-channels is equal to the capacity of this channel.

SUMMARY

Illustrative embodiments are disclosed by way of example in the description and claims.

According to one aspect of the present disclosure, an apparatus for encoding and transmitting input bits includes an encoder, a sub-channel selector, and a transmitter. The sub-channel selector is configured to select, from each of a plurality of non-adjacent segments that each comprise a subset of sub-channels with associated reliabilities, an assistant sub-channel to carry a decoding assistant bit in the input bits. The encoder is coupled to the sub-channel selector and is configured to encode the input bits to generate a code word. The transmitter is coupled to the encoder, to transmit the code word generated by the encoder.

A method for encoding and transmitting input bits according to another aspect of the present disclosure involves selecting, from each of a number of non-adjacent segments, an assistant sub-channel to carry a decoding assistant bit in input bits that are to be encoded. Each segment includes a subset of sub-channels with associated reliabilities. Such a method could also involve encoding the input bits to generate a code word, and transmitting the code word.

A further aspect relates to a non-transitory processor-readable medium storing instructions which, when executed by one or more processors, cause the one or more processors to perform a method. The method may be as disclosed above or elsewhere herein, and in an embodiment involves selecting an assistant sub-channel to carry a decoding assistant bit in input bits that are to be encoded. An assistant sub-channel is selected from each of a number of non-adjacent segments. Each segment includes a subset of sub-channels with associated reliabilities. A method could also involve encoding the input bits to generate a code word, and transmitting the code word.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing one example of how a polar coding generator matrix can be produced from a kernel.

FIG. 2 is a diagram showing an example use of a polar coding generator matrix for producing code words and a schematic illustration of an example polar encoder.

FIG. 3 illustrates an example of an SC (Successive Cancellation) decoding algorithm.

FIG. 8 is a block diagram illustrating a sub-channel reliability sequence.

FIG. 9 is a block diagram illustrating assistant sub-channel selection according to another embodiment.

DETAILED DESCRIPTION

Figure 4:
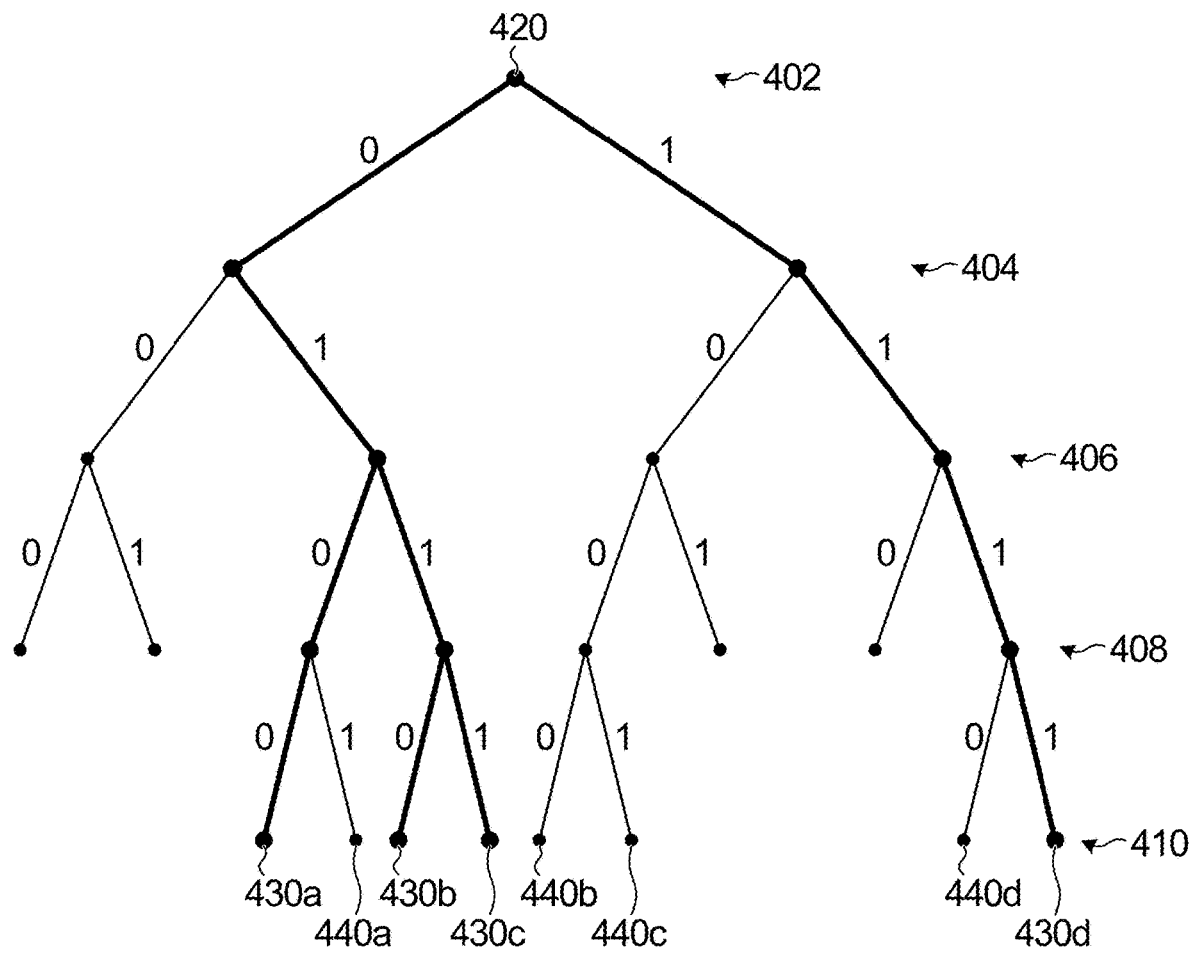
FIG. 4 is a diagram showing a portion of an example decision list tree whose width is limited by a maximum given list size and used in an SCL (Successive Cancellation List) polar decoder.

FIG. 1 is a diagram showing, by way of an illustrative example, how a polar coding generator matrix can be produced from a kernel $G_2$ 100. Note that FIG. 1 is an example. In the present disclosure, other forms of kernel are also considered. Polarization comes from the "nested" way in which a generator matrix is created from a kernel (or combination of kernels), in accordance with an aspect of the present disclosure.

A polar code can be formed from a Kronecker product matrix based on a seed matrix $F=G_2$ 100. For a polar code having code words of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$, for code length $N=2^m$.

FIG. 2 is a diagram showing an example use of a polar coding generator matrix for producing code words and a schematic illustration of an example polar encoder. In general, $$x_0^{N-1}=[x_0,x_1\ldots,x_{N-1}]$$

$$u_0^{N-1}=[u_0,u_1\ldots,u_{N-1}]$$

$$x_0^{N-1}=u_0^{N-1}G_N$$

In FIG. 2, the generator matrix $G_2^{\otimes 3}$ 104 is used to produce code words of length $2^3=8$. A code word x is formed by the product of an input vector $u=[0\ 0\ 0\ u_3\ 0\ u_5\ u_6\ u_7]$ and the generator matrix $G_2^{\otimes 3}$ 104 as indicated at 200.

The input vector u is composed of information bits and fixed or frozen bits. In the specific example shown in FIG. 2, N=8, so the input vector u is an 8-bit vector, and the code word x is an 8-bit vector. The input vector has frozen bits in positions 0, 1, 2 and 4, and has information bits at positions 3, 5, 6, and 7. An example implementation of an encoder that generates code words is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 2 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n\geq 1$ (e.g. for n=1, $G_2=F$ (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed characteristics of the physical channel before the information is transmitted over the channel, for example. In theory, the frozen bits can be set to any value as long as the location and the value of each frozen bit is known to both the encoder and the decoder. In conventional applications, the frozen bits are all set to zero.

With a sufficiently long code length, a code designed according to polarization theory can reach the channel capacity of a binary symmetric memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one code word. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from K information bits including one or more CRC bits, and (N−K) frozen bits. In this example, starting with a number of input bits, a CRC is calculated and appended to the input bits to produce a set of K information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit code word.

The code word is transmitted over a channel, and a receiver, in turn, receives a word. Due to channel effects such as noise, the received word might not be identical to the transmitted code word. A decoder attempts to decode the received word to determine information bits in the original input vector.

During decoding of a code word encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit. FIG. 3 illustrates an example of an SC decoding algorithm.

Another type of polar decoding algorithm, which is an extension of SC polar decoding but with better error correction performance and greater space efficiency, referred to as a List decoder, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the code word to assist in decoding. For example, if the code word includes encoded CRC bits for the previous information bits, then once the decision tree is generated, each of the surviving paths that correspond to the decoded information bits is checked against the CRC bits represented in each of the surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the code word does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For every decoded bit, a decoding path generates 2 leaf branches (bit=0|1) for the next decoding bit. An SC decoder tracks only one decoding path. After the value of a decoded bit is estimated, the other possible value is ignored. Decoding continues with the next bit, assuming that each previous bit has been correctly estimated when updating partial sum results.

Although tracking multiple decoding paths as in SCL decoding may offer better decoding performance than single-path tracking as in SC decoders, multi-path decoder size and complexity increases with code word length and with list size L. For example, for a code word length N=8 with a 2-by-2 kernel, there are $2^8$=256 possibilities for estimated values $\hat{u}_0$ to $\hat{u}_7$. Other kernel sizes have different numbers of possibilities, such as $3^8$ for N=8 and a 3-by-3 kernel. As code word length increases, the number of possibilities grows exponentially, and tracking of all decoding paths for all combinations of $\hat{u}_x$ becomes impractical. By tracking multiple decoding paths according to a list of size L, SCL decoders may still offer better decoding performance than SC decoders, with reasonable size and complexity. An SCL decoder monitors the best L decoding paths and estimates information bit values for the L decoding paths by combining Log Likelihood Ratio (LLR) values with previously computed partial sum values.

Each decoding path from the root (decoded bit #0) of a decoding tree is associated with a Path Metric (PM). A decoding path appends each newly decoded bit to previous estimated values. After the LLR computations for each decoded bit, path metrics are continuously updated using the LLR values as follows:

if the LLR value >=0
  PM[0, i+1]=PM[i]
  PM[1, i+1]=PM[i]+|LLR|
if the LLR value <0
  PM[0, i+1]=PM[i]+|LLR|
  PM[1, i+1]=PM[i].

The best decoding paths have the smallest PM values. If an LLR is less than 0, then decoded bit is most likely a 1, so the next PM for the estimated value 1 (PM[1, i+1]) remains the same as the current path metric, and the absolute LLR value is added to the PM for the estimated value 0 (PM[0, i+1]), in effect "penalizing" the less likely path with the absolute LLR value. If the LLR value is near 0, then the decision for the value of $\hat{u}_x$ is unreliable and the PM penalty on the penalized path is small.

For every decoded bit in a decoding tree, each decoding path produces 2 new decoding paths for a 2-by-2 kernel in the example shown. Each "leaf" decoding path inherits the LLR, partial sum, and PM values from its parent. After the number of decoding paths reaches L, an SCL decoder selects, based on the 2L PMs for the 2L candidate decoding paths, the L paths with the lowest PMs, and drops the other L decoding paths. The selected L paths are sorted using the PMs. For example, path sorting could assign path identifiers (IDs) or indices to the selected paths, with the path having the best PM being assigned a path ID #1, a path with the worst PM being assigned path ID #L, and other paths being assigned path IDs #2 to #(L−1) in accordance with their PMs. New decoding path IDs could be assigned after each sort step, following estimation of each code word bit.

FIG. 4 is a diagram showing a portion of an example decision list tree used in an SCL polar decoder, whose width is limited by a maximum given list size L. In FIG. 4 the list size L is 4. Five levels 402, 404, 406, 408, 410 of the decision tree are illustrated. Although five levels are illustrated, it should be understood that a decision tree to decode K information bits (including CRC bits) would have K+1 levels. At each level after the root level 402, each one of up to 4 surviving decoding paths is extended by one bit. The leaf or child nodes of root node 420 represent possible choices for a first bit, and subsequent leaf nodes represent possible choices for subsequent bits. The decoding path from the root node 420 to leaf node 430a, for example, represents an estimated code word bit sequence: 0, 1, 0, 0. At level 408, the number of possible paths is greater than L, so L paths having the highest likelihood (e.g., best PMs) are identified, and the remaining paths are discarded. The decoding paths that survive after the path sort at level 406 are shown in bold in FIG. 4. Similarly, at level 410, the number of possible paths is again greater than L, so the L paths having the highest likelihood (e.g., best PMs) are identified, and the remaining paths are again discarded. In the example shown, the paths terminating in leaf nodes 430a, 430b, 430c, and 430d represent the highest likelihood paths. The paths terminating in leaf nodes 440a, 440b, 440c, 440d are the lower likelihood paths which are discarded.

SCL decoding can be further divided into pure list decoding in which survivor paths with the highest likelihood are selected and CRC-Aided SCL (CA-SCL) decoding where CRC bits are used for path selection. SC decoding is a special case of pure list decoding, with list size L=1. A CRC may provide better error correction performance in the final path selection, but is optional in SCL decoding. Other decoding-assistant operations such as a Parity Check (PC)

based on parity or "PC" bits that are included in an input vector, could be used instead of or jointly with CRC bits in path selection during decoding or in the final path selection.

SCL decoding largely improves the performance of a polar code for a limited code size. However, compared with the similar code length and code rates of Low Density Parity Check (LDPC) codes and Turbo codes, SCL decoding may have a worse Block Error Rate (BLER) than well-designed LDPC and Turbo codes. CA-SCL decoding may improve the performance of a polar code with a limited code length. For example, a CA-SCL decoder with a list size L=32 could provide for much better performance than LDPC and Turbo codes with similar computational complexity.

In an Additive White Gaussian Noise (AWGN) channel, a polar code in effect divides a channel into N sub-channels, where N is referred to as mother code length and is always is power of 2 in an Arikan polar code, which is based on a polar kernel that is a 2×2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to parity, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits. In some embodiments, assistant bits are considered to be a form of information bits, for which more reliable sub-channels are selected or allocated.

Figure 5:
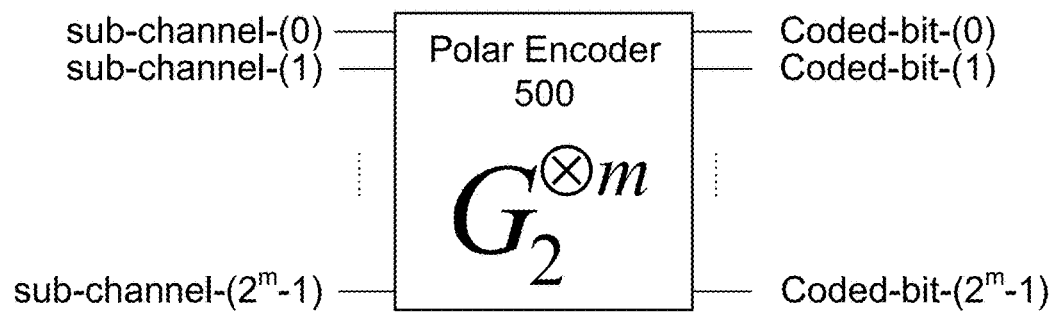
FIG. 5 is a block diagram illustrating an example of a polar encoder based on a 2-by-2 kernel.

Polar encoders based on Kronecker products of a 2-by-2 Arikan kernel $G_2$ are described above. FIG. 5 is a block diagram illustrating an example of a polar encoder 500 based on a 2-by-2 kernel. Sub-channels and coded bits are labeled in FIG. 5. As discussed in further detail below, a channel is divided into N sub-channels. An information block and frozen bits are allocated onto the N sub-channels, and the resultant N-sized vector is multiplied with an N-by-N Kronecker matrix by the polar encoder to generate a code word that includes N coded bits. An information block includes at least information bits and could also include assistant bits such as CRC bits or parity check bits. A sub-channel selector (not shown) could be coupled to the polar encoder 500 to select at least information sub-channels and assistant sub-channels, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching other purposes.

As a result of SC, SCL, or CA-SCL decoding, the polarization phenomenon appears over the sub-channels. Some sub-channels have high capacity, and some sub-channels have low capacity. Put another way, some sub-channels have high Signal-to-Noise Ratio (SNR) and others have low SNR. These metrics are examples of characteristics that could be used to quantify or classify sub-channel "reliability".

An initial step in code construction is to compute the reliabilities for all of the sub-channels, and then select the highest reliability sub-channels for information bits and any CRC bits, parity/PC bits, and/or other assistant bits that are used to assist in decoding.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

There are several methods to compute sub-channel reliabilities, but these methods may lead to different results. For example, according to a genie-aided method proposed in R. Pedarsani, "Polar Codes: Construction and Performance Analysis", June 2011, EPFL master project, an encoder encodes a training sequence that is known to the decoder on different sub-channels. The decoder feeds back decoding results to the encoder so that the encoder can compute reliability statistics for every sub-channel, and a well-adapted reliability-vector over the sub-channels is obtained. The training procedure takes place with a given SNR, and therefore this method is SNR-related and not in real time.

As another example, Mori R, Tanaka T., "Performance and construction of polar codes on symmetric binary-input memoryless channels", IEEE International Symposium on Information Theory, 2009, 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. However, because the method relies on iterative calculations of LLR values for each sub-channel, it is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes on different sub-channels a training sequence that is known to the decoder. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method.

Gaussian-approximation methods as proposed in J. Dai, K. Niu, Z. Si, J. Lin, "Evaluation and Optimization of Gaussian Approximation for Polar Codes", May 2016, and in P. Trifonov, "Efficient design and decoding of polar codes." IEEE Trans. on Communications 60.11 (2012): 3221-3227, assume that every coded bit is subjected to an equal error probability. From the error probability, the reliabilities over the sub-channels are obtained with a density evolution algorithm. Because this error probability on the coded bits is related to the receiving SNR, this method is also SNR-related and is computationally complex.

In mobile wireless communications, the radio channel is time-varying. It is impractical to consume significant communication bandwidth and processing resources for a genie-aided construction method. Gaussian-approximation may therefore be preferred, in conjunction with fixing a working SNR or reference SNR for a particular combination of code length and code rate.

However, Gaussian-approximation-based methods for computing reliabilities over the sub-channels are also highly complex. With shorter and shorter decoding latency requirements in some applications, it can be difficult to implement hardware for practical on-the-fly reliability computations. Storing all reliability vectors for all possible values of N and working SNRs would consume more memory than would be practical in a mobile wireless system, for example, and therefore in such an application it is necessary to re-compute sub-channel reliabilities whenever the mother code length N is changed.

Gaussian-approximation-based methods also require an SNR input. Different SNR inputs result in different reliability vectors. In order to align both an encoder and a decoder, a working SNR must be provided to both the encoder and the decoder. Also, any offset between a working SNR value that is used by the encoder and decoder and a real channel SNR at the decoder leads to performance loss.

An SNR-independent polarization weight (PW) method is disclosed in R1-1611254, "Details of the Polar Code Design", Huawei & HiSilicon, 3GPP TSG RAN WG1 Meeting #87. In this method, the reliability of a sub-channel is measured by the corresponding beta-expansion values, which are given by a closed-form formula as a function of the binary representation of the sub-channel index. The reliability measure is SNR-independent, and can lead to a single nested ordered sub-channel sequence for different coding rates and block lengths. The sequence may be calculated offline and stored in memory for use, to provide a lower implementation and computational complexity relative to other methods.

As mentioned above, there are several ways to generate an ordered sequence (from a kernel and its generator matrix) via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a Hamming weight as disclosed in U.S. patent application Ser. No. 62/438,565, filed on Dec. 23, 2016, both of which are entirely incorporated herein by reference. Other techniques could also or instead be used.

Ordered sequence computations can be performed in a number of different ways. For example, the computations could be performed online, producing ordered sequences that can be dynamically adjusted or recomputed based on, for example, observed channel conditions. The computations may alternatively be performed offline (i.e. in advance) to produce pre-computed (and static) ordered sequences that can be stored and retrieved during subsequent coding operations. In yet another alternative, the computations may be performed partially online and partially offline.

As noted above, in mobile wireless communications, the channel conditions may significantly vary in time. It may be impractical to use online sequence computing methods with high computational complexity (e.g. genie-aided, DE and GA-based methods) because those methods may consume significant communication bandwidth and processing resources. Computationally complex methods, such as Genie-aided, DE and/or GA-based methods, are generally performed offline instead to produce multiple static ordered sequences, for example, by fixing a working SNR or reference SNR for different combinations of code length and code rate. However, simple online sequence generation methods such as those disclosed in U.S. patent application Ser. No. 62/463,128 entitled "APPARATUS AND METHODS OF SPECIFYING ORDERED SEQUENCES OF CODING SUB-CHANNELS" filed on Feb. 24, 2017 and incorporated herein by reference in its entirety may still be preferred, in that they generally consume less memory, and may be more flexible and adaptive to time-varying wireless channel conditions.

As disclosed herein, some sub-channels may be used to transmit assistant bits that decoders will use to assist in decoding. Such assistant bits could be used to assist in path selection during decoding, for example. Selection of a correct decoding path could in effect correct errors in a received word, and in this sense path selection could be considered as embodying a form of error correction.

Assistant bits are neither information bits (code block-level CRC bits are treated as information bits in an embodiment herein) nor frozen bits, but may be generated from information bits by a rule that is known to both an encoder and a decoder. These bits could be considered error detection bits, error correction bits, or path selection bits, for example, but are referred to herein primarily as assistant or decoding-assistant bits. Examples of assistant bits include extra CRC bits, parity or PC bits, and checksum bits.

For illustrative purposes, assistant bits are described below as being allocated to sub-channels that are separate from sub-channels used for information bits and frozen bits. Assistant bits could provide for an extra CRC reserved for CA-SCL decoding apart from normal CRC bits appended to a code block. This is an example of one special case of the present disclosure of assistant bits and assistant sub-channels, which in one embodiment are selected after all of the information sub-channels have been selected. In another embodiment, the assistant sub-channels are selected from the frozen sub-channel space, for example from sub-channels that normally would be used for frozen bits.

The assistant sub-channels that transmit decoding-assistant bits could be scattered over the entire sub-channel space, which could be preferred for better performance, or occupy at least some consecutive sub-channel positions. The number of these assistant sub-channels could be more than one, and up to (N−K). This maximum number (N−K) varies with code length and code rate, and the number of assistant bits could be controlled for simpler decoding complexity. In an embodiment, the first assistant sub-channels appear after several information sub-channels, because an SC-based decoder processes the information bits first, and then decodes assistant bits to assist in selecting the path over the previously processed information bits.

Therefore, sub-channels could include information sub-channels for information bits, assistant sub-channels for decoding-assistant bits, and frozen sub-channels for frozen bits.

Figure 6:
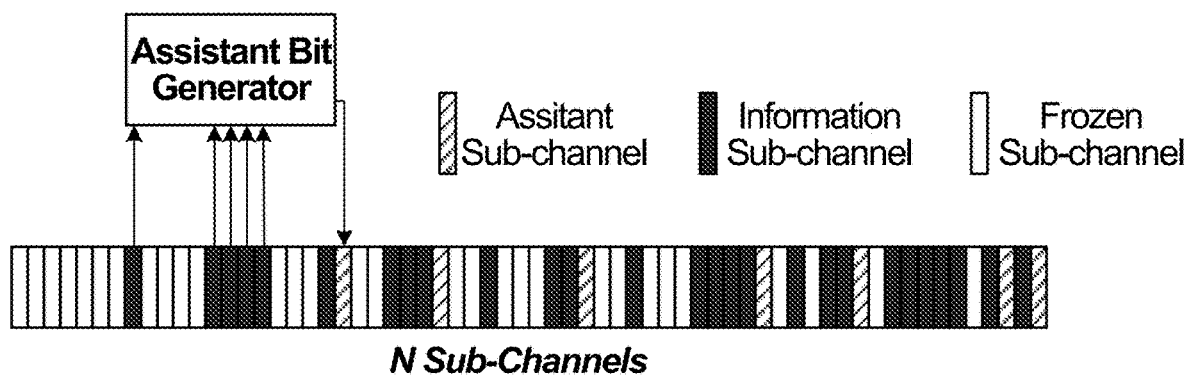
FIG. 6 is a block diagram illustrating an example of assistant bit generation and assistant sub-channel allocation.

FIG. 6 is a block diagram illustrating an example of assistant bit generation and assistant sub-channel allocation. According to a rule that is known or otherwise distributed to an encoder and a decoder, an assistant bit is generated based on a number of information bits that are allocated to information sub-channels, and the assistant bit is allocated to an assistant sub-channel after the information sub-channels that encode those information bits. Multiple assistant bits could be generated and assigned to assistant sub-channels, as shown in FIG. 6. Distributed assistant sub-channels are shown in FIG. 6 by way of example. Assistant sub-channels could also or instead include multiple consecutive sub-channels.

In an embodiment, one or more checksums are added as assistant bits to assist a decoder to determine or select the paths of a list decoding procedure. A checksum is a small-sized datum (checksum bits) from some or all bits of an input information block for the purpose of error detection. The procedure that yields a checksum is called checksum function. For example, parity-check bits are a kind of checksum and parity-check function is a checksum function that yields parity-check bits. CRC bits are a type of parity-check bits and a CRC encoder implements a type of parity-check function.

Whether such checksum bits, or other types of assistant bits, are used and how they are used could be decoding implementation-dependent. For example, if current channel conditions are very good (high SNR relative to a threshold), then a decoder could determine that checksum bits need not be used to assist in decoding a current CB (code block), or a decoder could use checksum bits to terminate a decoding process early if it detects a decoding failure based on the checksum bits.

A checksum need not be used only to determine whether an entire CB is correctly decoded. For example, a single CB could contain more than one checksum. If more than one checksum is taken in one CB, then these checksums could be yielded by different checksum functions or one checksum function, and from different portions or the same portion of an information block.

Unlike the CRC bits appended to each CB (code block), these checksum bits could be transparent to higher layers but known only to a channel encoder and decoder. The number of checksum bits could be either fixed or variable. For example, this number could be dependent on code length and/or code rate. Checksum bits could be assigned or allocated to consecutive sub-channels, and/or to non-consecutive sub-channels as shown in FIG. 6.

An SC or SCL decoder could make use of assistant bits in path selection and/or, in the case of an SCL decoder, to prune a list tree, during an SC-based decoding procedure.

Generally, for an assistant bit-based polar code, certain sub-channels are allocated or selected for assistant bits in accordance to a sub-channel allocation or assignment pattern that includes allocations for information, assistant, and frozen sub-channels. The sub-channel allocation pattern may be determined or established as a function of $\{K, M\}$ where K is the information block length for encoding and M is the code length, after rate matching if rate matching is applied. Typically, both an encoder and a decoder will produce or use the same sub-channel allocation pattern so that the encoded information can be properly decoded.

The assistant sub-channels selected should be sufficiently reliable for assistant bits such as parity-check bits, since the assistant bits are intended to assist in decoding other bits. The most reliable sub-channels within subsets of sub-channels, from which assistant sub-channels are selected, may be preferred for the assistant sub-channels. In other embodiments, sub-channels other than the most reliable sub-channels could be selected as assistant sub-channels. In general, assistant sub-channel selection could be based on sub-channel reliabilities.

It may also or instead be preferred to distribute assistant sub-channels over a sub-channel space, as shown in FIG. 6.

An assistant sub-channel selection procedure that is as simple as possible could be preferred to support low-latency code construction in either or both of an encoder and a decoder.

There are many different selection procedures that can be used for selecting assistant sub-channels as well as sub-channels for information and/or frozen bits. Examples (incorporated herein by reference in their entirety) include:

U.S. Provisional Patent Application 62/395,312, filed on Sep. 15, 2016 and entitled "Method and Device for Assigning Dynamic Frozen Bits and Constructing a Parity Function on them in a Polar Code"—hereinafter "[1]";

U.S. Provisional Patent Application 62/432,448, filed on Dec. 9, 2016 and entitled "Method for Constructing a Parity Check (PC) Based Polar Code Using a Look-up Table"—hereinafter "[2]";

U.S. Provisional Patent Application 62/432,416 filed on Dec. 9, 2016 and entitled "Method and System to Parallelize Parity Check (PC)-Polar Construction" hereinafter "[3]";

U.S. Provisional Patent Application 62/433,127 filed on Dec. 12, 2016 and entitled "Method for Constructing a Parity Check (PC) Based on Polar Code Using a Look-Up Table—hereinafter "[4]"; and U.S. patent application Ser. No. 62/438,550 filed on Dec. $23^{rd}$ and entitled "Apparatus and Methods for Polar Code Construction—hereinafter "[5]".

In these examples, information sub-channels can be selected based on a polarization reliability metric (e.g. based on polarization weights), while the selection of assistant sub-channels may depend on metrics such as a hamming weight of the sub-channels (or a function of the hamming weight), a natural order of the sub-channel indices, etc. In some implementations, for example, depending on the coding rate, the number of information bits to be encoded and/or the assistant bit generation function used, the sub-channel selection techniques described in [1]-[5] could involve several steps or loops and therefore introduce processing latency, and/or result in a relatively large number of assistant sub-channels (over 80 bits in some cases), which could further increase the latency on both an encoder and a decoder and/or impact the coding rate.

It may therefore be desirable in some implementations to use simpler sub-channel selection techniques that may be more easily implemented and/or be less computationally intensive. The number of the assistant sub-channels could also or instead be reduced to a smaller range without performance loss, by specifying a target number of assistant bits and designing a code with a sub-channel pattern based on the target number. In addition, parallelization of sub-channel selection could contribute to lower sub-channel selection latency.

As noted above, the present disclosure refers primarily to a 2-by-2 kernel as example to demonstrate and explain illustrative embodiments. However, it is understood that the techniques for determining sub-channel patterns as disclosed herein could be applied to other types of polarization kernels as well, for example, a non-two prime number dimension kernel or non-primary dimension kernel or higher dimension kernels formed by a combination of different (primary or non-primary) dimensions of kernels such as those disclosed in [5]. The present disclosure can also be applied for polar codes constructed based on kernels defined over a non-binary field, e.g. Galois fields of size $q>2$. However, once the assistant sub-channels have been selected, PC equations are defined by coefficients taking values from the corresponding Galois field.

According to an aspect of the present disclosure an assistant bit-based polar code is designed according to the principles outlined below. In the example embodiments described in detail below, K is the length of an information block, N is a power-of-two mother code length, PCF is a target number of assistant sub-channels, $Q_N$ is an ordered sequence of sub-channels in order of polarization weights (as an example of an order based on polarization reliabilities), $\mathcal{A}$ is the set of the information sub-channels, $\mathcal{F}$ is the set of the frozen sub-channels, and $\mathcal{F}^*$ is the set of the assistant sub-channels.

Step-1: In an embodiment, an (N, K+PCF) polar code is first constructed by selecting the most reliable (K+PCF) sub-channels according to $Q_N$. In this example, $Q_N$ is a reliability sequence based on polarization weights but it is understood that $Q_N$ may be based on a different reliability metric. For example, U.S. Provisional Patent Application 62/438,565 filed Dec. 23, 2016 and entitled "System and Method to Generate an Ordered Sequence for Polar Codes" incorporated herein by reference describes a reliability sequence generated based on the Hamming weight of the sub-channels. Other possibilities exist for $Q_N$. If a puncturing scheme is used, then these sub-channels could instead be designated as frozen channels in $\mathcal{F}$ prior to the selection of the (K+PCF) sub-channels. Such a polar code will have K+PCF information sub-channels specified in the set $\mathcal{A}$, (N−K−PCF) frozen sub-channels specified in $\mathcal{F}$, and zero assistant sub-channels in the set $\mathcal{F}^*$ at this initial stage.

Step-2: Next, PCF information sub-channels are selected as assistant sub-channels. The assistant sub-channels in this example are chosen from $\mathcal{A}$ and changed to assistant sub-channels $\mathcal{F}^*$. This results in a sub-channel pattern with K information sub-channels, N−K−PCF frozen sub-channels, and PCF assistant sub-channels.

The assistant sub-channel selection is "nested" in an embodiment, and involves choosing or selecting assistant sub-channel from non-adjacent segments that include respective subsets of (possibly consecutive) sub-channels. This is further described by way of example in "ii" below, and some embodiments also involve dividing or grouping sub-channels, such as described in "i" below:

i. Dividing or grouping the N sub-channels into $$\frac{N}{L}$$

segments, each of which has L sub-channels that are consecutive in the natural order of the sub-channel indices.

A first segment consists of the sub-channels from $u_0, \ldots, u_{L-1}$ (with $u_a$ here denoting sub-channels), a second segment consists of the sub-channels $u_L, \ldots, u_{2L-1}$, and more generally the i-th segment consisting of $u_{(i-1)L}, \ldots, u_{iL-1}$. Each segment i is associated with a subset $\mathcal{A}_i$ of $\mathcal{A}$, and a coding rate $$\frac{\omega_i}{L},$$

wherein $\omega_i$ is the number of information sub-channels of the constructed polar code that are in the segment $u_{(i-1)L}, \ldots, u_{iL-1}$. Note that the information sub-channels might not be uniformly distributed over the entire sub-channel space, and therefore $\omega_i$ could be different for different segments.

ii. Choosing or selecting an assistant sub-channel in non-adjacent segments.

For example, the most reliable sub-channel in $\mathcal{A}_i$ could be selected according to $Q_L$ in the even-number segments $$i = 2, 4, \ldots, 2i, \ldots, \frac{N}{L},$$

and changed to assistant sub-channels $\mathcal{F}^*_i$. Instead of the most reliable sub-channel, the least reliable information sub-channel could be selected as (and changed to) assistant sub-channel. Other criteria could be used as well for the selection. In this example, the choosing or selecting may involve:

The selection of the assistant sub-channels based on both polarization reliability and the natural order of the sub-channels, because polarization reliability increases on average along the natural order of sub-channels.

The selections of $\mathcal{F}^*_i$ on all even-number segments in parallel with the same $Q_L$, a reliability ordered sequence for a polar code of length L. $Q_L$ is a nested subset of $Q_N$.

The assistant sub-channels are selected only from the even-numbered segments in this example because the polarization reliability on the even-numbered segments (i) is on average greater than that on the odd-numbered segments (i−1). Since each even-numbered segment contributes one assistant sub-channel in this example and there are N/2L even-numbered segments, $$\frac{N}{2L}$$

assistant sub-channels are selected in $\mathcal{F}^*$.

iii. Checking or determining whether the size of $\mathcal{F}^*$, corresponding to the number of assistant sub-channels selected, reaches the target PCF.

If so, then the assistant sub-channel selection is complete, and input bits including information bits, assistant bits, and frozen bits can be encoded. Otherwise, ii is repeated for different segments. Some embodiments involve re-dividing or re-grouping sub-channels, such as described in "iv" below.

iv. Regrouping sub-channel segments into regrouped segments that include a different number of sub-channels. This involves merging pairs of adjacent segments together in an embodiment. For example, segment 1 and segment 2 could be merged into a new segment 1. More generally, segment (2i−1) and segment (2i) are merged into a new segment (i). This results in $$\frac{N}{2L}$$

larger segments, each of which has 2L sub-channels. In this example, the number of segments is halved, but the size of each segment (the number of sub-channels in each segment) is doubled. Sub-channels could be otherwise regrouped in other embodiments. For example, more than two groups could be combined into new groups for a next iteration of assistant sub-channel selection. It should also be noted that sub-channel segments need not necessarily all be of the same size. Allowing different segment lengths within the same iteration could impact parallelization, for example in embodiments in which polarization reliability sequences of different lengths are used to select assistant sub-channels from segments of different sizes. However, even in such embodiments a degree of parallelization could be realized by applying the different Q sequences of different lengths to different segments in parallel during an iteration.

The operations at i-iv as outlined above, or similar operations, may be repeated to obtain up to $$\frac{N}{2L} + \frac{N}{4L} + \frac{N}{8L} + \ldots + 2 + 1 = \frac{N}{L} - 1$$

assistant sub-channels in $\mathcal{F}^*$, or N/L assistant sub-channels if a final iteration is performed over the entire set of N sub-channels (L=N). The total number of sub-channels in $\mathcal{F}^*$ could be either N/L−1 or N/L. The resultant assistant sub-channel pattern, like $Q_N$, also has a nested property in this example. Compared with the other methods in [1] to [5], the assistant sub-channels selected according to this example are distributed over the sub-channel space more "randomly".

Figure 7:
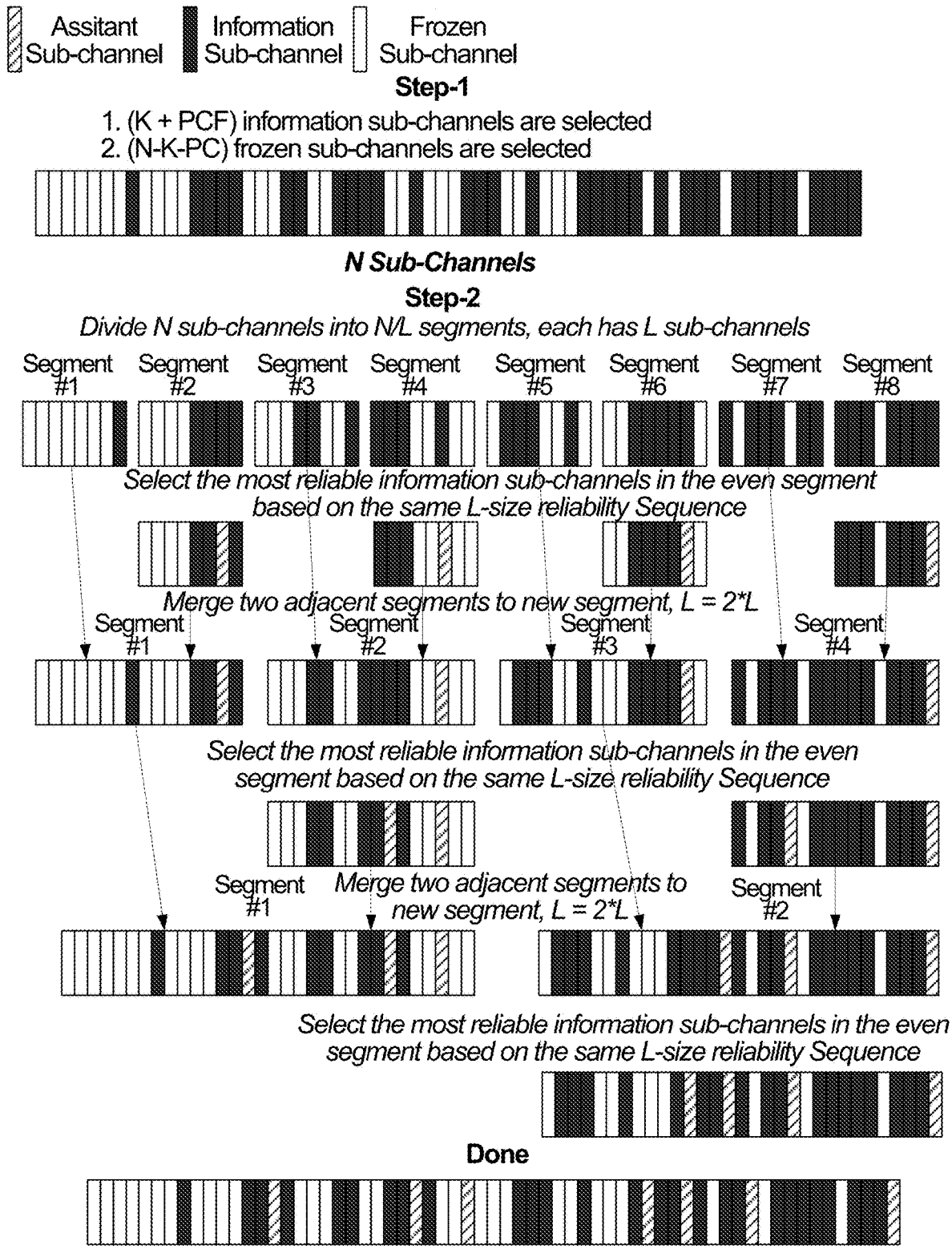
FIG. 7 is a block diagram illustrating assistant sub-channel selection according to an embodiment.

FIG. 7 is a block diagram illustrating assistant sub-channel selection according to an embodiment, and shows Step-1 and Step-2 as outlined above. Assistant sub-channels are selected from the even-numbered segments at each selection stage of Step-2 in FIG. 7 in parallel, which can reduce latency associated with sub-channel selection. Sub-channel selection from each segment in a stage is independent of sub-channel selection from each other segment in that stage, and therefore sub-channels can be selected from multiple segments at that same stage in parallel. Even with different-length segments at the same stage, sub-channels could be selected from all segments at that stage in parallel.

In the above example, even-numbered assistant sub-channel searching is an embodiment of a more general concept of non-adjacent segment searching for selection of assistant sub-channels. However, in other embodiments, an assistant sub-channel(s) search could be performed on odd-numbered segments, even if performance might be poorer than for an even-numbered segment search. Odd-numbered segments are another example of non-adjacent sub-channel segments, and further types of non-adjacent segment searching are also possible. Considering a group of three segments, for example, one could limit the assistant sub-channel searching to the third segment of each three-segment group, the second segment of each three-segment group, or the first segment of each three-segment group, or even alternate between different segments of three-segment segment groups so that assistant sub-channels are selected from non-adjacent segments of sub-channels.

The above example also refers to selecting one assistant sub-channel per non-adjacent sub-channel segment. This does not preclude selection of multiple assistant sub-channels in one or more segments in other embodiments.

The number of assistant sub-channels selected within different segments could also or instead be different. Different segments could have different numbers of assistant sub-channels, including zero, chosen from them. For instance, an assistant sub-channel need not necessarily be selected from every even segment in the above example, and more than one assistant sub-channel could be selected from one or more other even segments. In an embodiment in which information sub-channels are selected first and assistant sub-channels are selected from the information sub-channels, for example, not every segment might include an information sub-channel, and no assistant sub-channel would be selected from such a segment.

The number of assistant sub-channels to be selected from each segment could be predetermined, or variable. In some embodiments, an additional assistant sub-channel could be selected from one or more segments based on the number of assistant sub-channels that remain to be selected in order to meet the target number of assistant sub-channels. Suppose, for example, that the target number of assistant sub-channels to be selected is 5, and at the end of a current selection iteration 4 sub-channels have been selected. An additional assistant sub-channel could be selected from a current segment to reach the target of 5 assistant sub-channels instead of regrouping segments and running a further iteration.

FIG. 7 also shows a specific example in which N=48 with the first stage dividing the N sub-channels into eight segments of L=8 sub-channels per segment. The number of sub-channel segments could be different in different embodiments, and L need not be 8. For example, the target number of assistant bits and sub-channels (PCF above) is determined prior to code design, and the sub-channel pattern for the code is then determined based in part on PCF. This not only provides control of the number of assistant bits, to limit the number of assistant bits and sub-channels for example, but also enables segment length L to be determined based on a preferred number of iterations for selection of PCF assistant sub-channels.

A regrouping technique could also or instead be determined based on PCF and a preferred number of assistant sub-channel selection iterations. In the example shown in FIG. 7, doubling the size of the segments between the sub-channel selection stages or iterations reduces the sub-channels selected at each stage by one half. Increasing segment size by less than doubling the segment size between iterations would reduce the number of sub-channels selected in each iteration by less than one half, and similarly increasing segment size by more than doubling the segment size between iterations would reduce the number of sub-channels selected in each iteration by more than one half.

As noted above, more than one assistant sub-channel could be selected from a segment. The number of assistant sub-channels selected per segment could also be determined based on PCF and/or a preferred number of assistant sub-channel selection iterations.

Assistant bit-based coding could proceed with generating assistant bits to set bit values on the selected assistant sub-channels. In the context of the above example with Step-1 and Step-2, this is referred to herein as Step-3. Parity check or checksum functions or equations are examples illustrating how assistant bit values could be generated or set, and the following are two specific examples:

Example 1: Because the assistant sub-channels are distributed "randomly" and selected from the most reliable sub-channels in one segment in an embodiment, the assistant bits could be used to protect the least reliable information sub-channels. Therefore, the bit value that is set on an assistant sub-channel could be a copy of the least reliable information sub-channel that appears prior to the assistant sub-channel but after a preceding assistant sub-channel.

Example 2: The value of each assistant bit $u_i$ (here $u_i$ is referring to the bit value that is set on a sub-channel) is chosen as $$u_i = \sum_{k=1}^{\lfloor \frac{i-1}{p} \rfloor} u_{i-kp},$$

where p is a fixed parameter. Such an implementation can be done using a shift register as in [1].

Consider another example of (K=3, M=12, PCF=3) of polar code with a mother power-of-two code length of N=16, with reference to FIG. 8, which is a block diagram illustrating a sub-channel reliability sequence.

In this example, a puncturing pattern is computed in a deterministic way, by bit-reversing the highest binary sub-channel indices and marking the N-M indices corresponding to the bit-reversed N-M highest indices as punctured positions. Both an encoder and a decoder store the sequence $Q_0^{15}$=[0 1 2 4 8 3 5 6 9 10 12 7 11 13 14 15]. There are 4 bits to be punctured in this example (N−M=4) to obtain the code length M=12. The length-4 puncturing pattern P is computed by bit-reversing the sequence of highest indices [12(1100), 13(1101), 14(1110), 15(1111)] (=[M, N−3, N−2, N−1]) as P=[3(0011), 11(1011), 7(0111), 15(1111)]=[BitRev (M), BitRev(N−3), BitRev(N−2), BitRev(N−1)]. Based on the polarization weight of $Q_{16}$, select (K+PCF)=6 sub-channels are then selected as information sub-channels.

FIG. 9 is a block diagram illustrating assistant sub-channel selection in this example, according to another embodiment. Based on the above example $Q_0^{15}$, sub-channels 6, 9, 10, 12, 13, 14 could be initially selected as information sub-channels as shown at the top of FIG. 9. With a sub-channel segment size L=4 for a first iteration, the N=16 sub-channels are grouped into four segments, and an assistant sub-channel is selected in each of the even-numbered segments. These sub-channel selections are made in parallel, and based on the same $Q_4$, which is a subset of the above example $Q_0^{15}$. Sub-channels 6 and 14 are selected in this iteration.

For the second iteration, segments 1 and 2 are merged into a new segment 1, and segments 3 and 4 are merged into a new segment 2. Sub-channel 13 is selected as an assistant sub-channel based on $Q_8$, which is a subset of the above example $Q_0^{15}$. If there were multiple even-numbered sub-channel segments at this stage, then all assistant sub-channel selections could be performed in parallel based on the same $Q_8$.

In the example shown in FIG. 9, there are no information sub-channels preceding the first selected assistant sub-channel 6, and therefore there are no information bits for an assistant bit in sub-channel 6 to protect. The selected assistant sub-channel 6 could then be re-designated as a frozen channel, and coding is then based on only two assistant bits instead of three. The frozen sub-channel set F={0, 1, 2, 3, 4, 5, 6, 7, 8, 11, 15}, the punctured set P={3, 7, 11, 15} as shown in FIG. 8, the information sub-channel set A={9, 10, 12} and the assistant sub-channel set F*={13, 14}.

As another possible option, in the event that an assistant sub-channel has no preceding information sub-channels to protect, that assistant sub-channel could be re-designated as an information channel, and the next information channel could be re-designated as an assistant sub-channel. Such information/assistant sub-channel "swapping" could be used as an alternative to changing a selected assistant sub-channel to frozen as shown in FIG. 9.

Another possible option would be to re-designate a selected assistant channel that has no preceding information sub-channels as an information sub-channel and re-designating a different information channel with lower reliability than the assistant sub-channel as a frozen sub-channel.

These alternatives for handling an assistant sub-channel that has no preceding information sub-channels could be useful, for example, if the assistant sub-channel has a higher reliability than another information sub-channel. In the example above, sub-channel 6 has lower reliability than the other information sub-channels, and in this situation turning the assistant sub-channel 6 into a frozen channel as shown might be preferred.

The position(s) of one or more assistant sub-channels could also or instead be taken into account in determining whether to perform a further iteration for assistant sub-channel selection. For example, in FIG. 9, it could be determined after the second selection stage or iteration that there are no information sub-channels preceding the selected assistant sub-channel 6, and on that basis a further iteration to select another assistant sub-channel from a single segment including all 16 sub-channels could be performed.

In the first sub-channel stage or iteration in FIG. 9, the same $Q_4$ is used in selecting the assistant sub-channels in both of the even-numbered segments. In the case of different-length segments, two different Q sequences could be used to select assistant sub-channels from different-length segments. Even though two different Q sequences are used in this example, the sub-channel selections from different segments could still be made in parallel.

FIGS. 8 and 9 relate to just one example of puncturing. There are many other shortening and puncturing schemes. This is an example to show that some sub-channels could be firstly flagged as frozen or punctured sub-channels prior to selection of information sub-channels and assistant sub-channels. Other puncturing or shortening patterns, and similarly other types of coded bit processing, could be coordinated with information sub-channel selection and/or assistant sub-channel selection in other embodiments.

Figure 10:
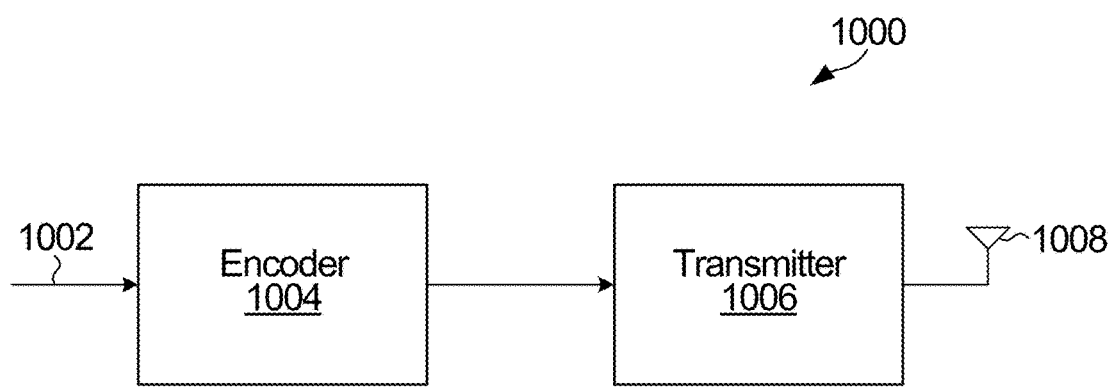
FIG. 10 is a block diagram of an example apparatus for encoding and transmitting code words.

FIG. 10 is a block diagram of an example apparatus for encoding and transmitting code words. The apparatus 1000 includes an encoder 1004 coupled to a transmitter 1006. The encoder 1004 is implemented in circuitry that is configured to encode an input bit stream 1002 as disclosed herein. In the illustrated embodiment, the apparatus 1000 also includes an antenna 1008, coupled to the transmitter 1006, for transmitting signals over a wireless channel. In some embodiments, the transmitter 1006 includes a modulator, an amplifier, and/or other components of a Radio Frequency (RF) transmit chain.

The encoder 1004 is implemented in circuitry, such as a processor, that is configured to encode input bits as disclosed herein. In a processor-based implementation of the encoder 1004, processor-executable instructions to configure a processor to perform encoding operations are stored in a non-transitory processor-readable medium. The non-transitory medium could include one or more solid-state memory devices and/or memory devices with movable and possibly removable storage media. More generally, the encoder 1604 may be implemented in hardware or circuitry (e.g. in one or more chipsets, microprocessors, application-specific integrated circuits (ASICs), field-programmable gate arrays (FPGAs), dedicated logic circuitry, or combinations thereof) so as to produce code words as described herein for transmission by a separate (RF) unit.

In some embodiments, the encoder 1004, a sub-channel selector coupled to the encoder, or a processor, for example, is configured to select, from each of a plurality of non-adjacent segments that each comprise a subset of sub-channels with associated reliabilities, an assistant sub-channel to carry a decoding assistant bit in the input bits. The encoder 1004, which could be coupled to a sub-channel selector or implemented using a processor in some embodiments, is configured to encode the input bits to generate a code word. The transmitter 1006 is coupled to the encoder 1004, or a processor in a processor-based embodiment, to transmit the code word.

In another embodiment, the encoder 1004, or a processor in a processor-based embodiment, is configured to encode input bits with a code that defines sub-channels, each of the sub-channels having an associated reliability of correct decoding of an input bit at an input bit position. The encoder 1004, a sub-channel selector coupled to the encoder, or a processor in a processor-based embodiment, for example, is configured to select, from each of a plurality of non-adjacent segments that each comprise a subset of consecutive sub-channels, and based on the associated reliabilities of the sub-channels, an assistant sub-channel to carry decoding assistant bits in the input bits. The transmitter 1006 is coupled to the encoder 1004, or a processor in a processor-based embodiment, to transmit the code words.

The apparatus 1000 could implement any of various other features that are disclosed herein. For example, any one or more of the following could be provided, alone or in any of various combinations, in embodiments:

the encoder, or a processor in a processor-based embodiment, is further configured to group the sub-channels into the segments;

the encoder, a sub-channel selector, or a processor in a processor-based embodiment, is further configured to determine whether a target number of assistant sub-channels have been selected, and if not, to select, from each of non-adjacent segments of a plurality of regrouped segments that each comprise a number of sub-channels that is different from a number of sub-channels in the segments, a further assistant sub-channel to carry a further decoding assistant bit in the input bits;

the sub-channels in each segment are consecutive sub-channels;

sub-channel selection is based on the associated reliabilities of the sub-channels;

the encoder, a sub-channel selector, or a processor in a processor-based embodiment, is further configured to regroup the sub-channels into the regrouped segments;

the encoder, a sub-channel selector, or a processor in a processor-based embodiment, is configured to regroup the sub-channels into the regrouped segments by combining multiple adjacent segments into the regrouped segments;

the encoder, a sub-channel selector, or a processor in a processor-based embodiment, is configured to combine pairs of adjacent segments into the regrouped segments;

the segments include the same number of sub-channels, which are consecutive sub-channels in some embodiments;

the decoding assistant bits are for error detection or path selection in a decoder;

the decoding assistant bits comprise one or more of: parity check, checksum, and CRC bits;

the apparatus further comprises an assistant bit generator, or a processor in a processor-based embodiment, to generate the decoding assistant bits;

the assistant bit generator, or a processor in a processor-based embodiment, is configured to generate the assistant bits in a manner consistent with example 1 or example 2 described above;

the encoder, a sub-channel selector, or a processor in a processor-based embodiment, is further configured to select information sub-channels to carry information bits in the input bits and frozen sub-channels to carry frozen bits in the input bits;

the encoder, a sub-channel selector, or a processor in a processor-based embodiment, is further configured to select the assistant sub-channels from among the information sub-channels in each non-adjacent segment.

In some alternative embodiments, the functionality of the encoder 1004, the transmitter 1006, and/or other components described herein may be fully or partially implemented in software or modules, for example in encoding and transmitting modules stored in a memory and executed by a processor(s) of the apparatus 1000.

Figure 11:
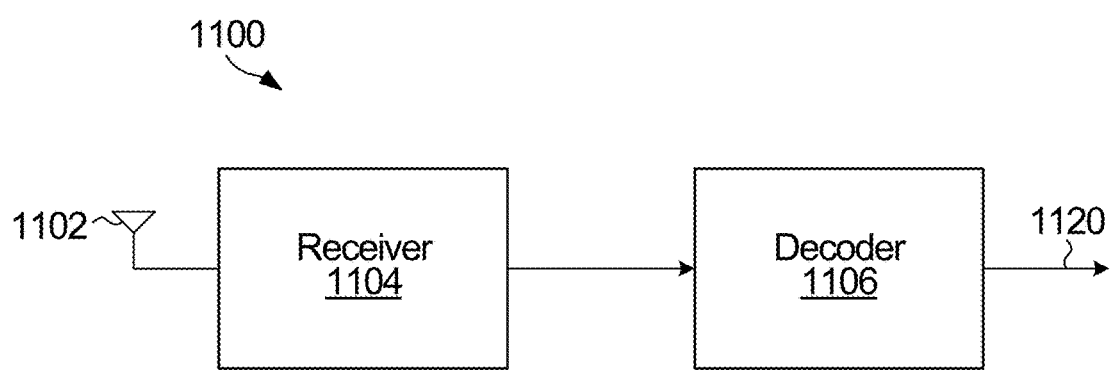
FIG. 11 is a block diagram of an example apparatus for receiving and decoding code words.

FIG. 11 is a block diagram of an example apparatus for receiving and decoding code words. The apparatus 1100 includes a receiver 1104 coupled to an antenna 1102 for receiving signals from a wireless channel, and a decoder 1106. In some embodiments, the receiver 1104 includes a demodulator, an amplifier, and/or other components of an RF receive chain. The receiver 1104 receives, via the antenna 1102, a word that is based on a code word of a polar code. Decoded bits are output at 1120 for further receiver processing.

In some embodiments, the apparatus 1100, and similarly the apparatus 1000 in FIG. 10 as noted above, include a non-transitory computer readable medium that includes instructions for execution by a processor to implement and/or control operation of the encoder 1004 in FIG. 10, to implement and/or control operation of the decoder 1106 in FIG. 11, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk.

The decoder 1106 is configured to decode received code words. Assistant bits could be used by the decoder 1106 to assist in decoding.

In some alternative embodiments, the functionality of the receiver 1104, the decoder 1106, and/or other components described herein may be fully or partially implemented in software or modules, for example in receiving and decoding modules stored in a memory and executed by a processor(s) of the apparatus 1100. In some embodiments, the decoder 1706 may be implemented in hardware or circuitry (e.g. in one or more chipsets, microprocessors, ASICs, FPGAs, dedicated logic circuitry, or combinations thereof) so as to decode code words that are received by a separate (RF) unit.

Communication equipment could include the apparatus 1000, the apparatus 1100, or both a transmitter and a receiver and both an encoder and a decoder. Such communication equipment could be user equipment or communication network equipment.

Figure 12:
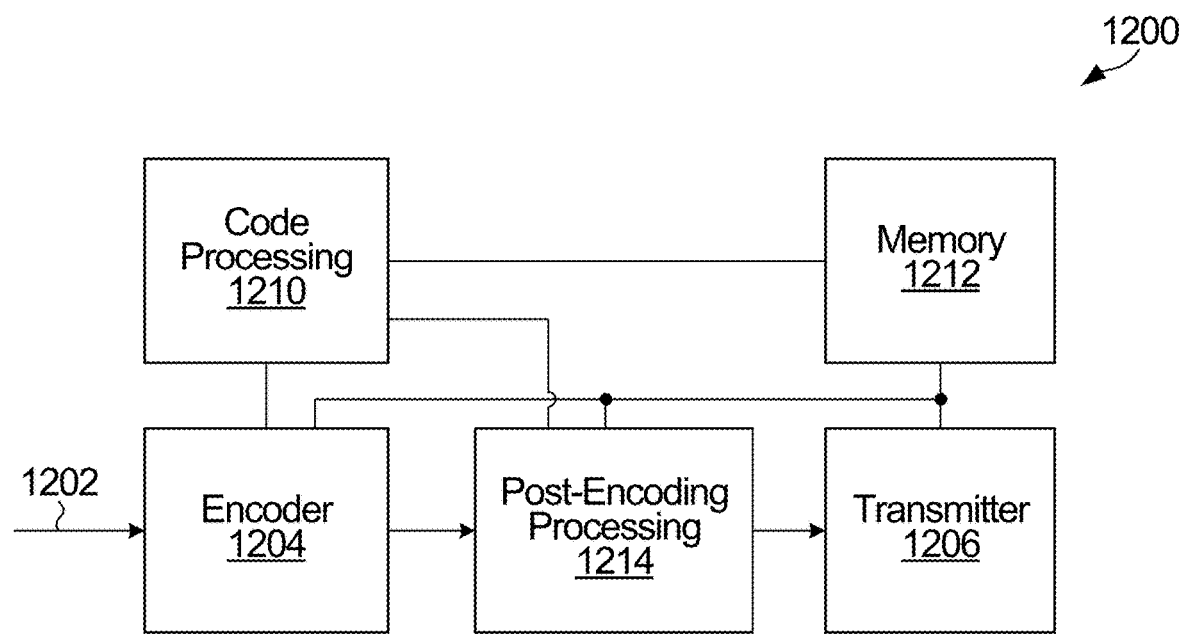
FIG. 12 is a block diagram of another example apparatus for encoding and transmitting code words.

FIG. 12 is a block diagram of another example apparatus for encoding and transmitting code words. The apparatus 1200 includes an encoder module 1204 coupled to a transmitter module 1206. The apparatus 1200 also includes a code processing module 1210 coupled to the encoder module 1204 and a post-encoding processing module 1214. The post-encoding processing module 1214 is also coupled to the encoder module 1204 and to the transmitter module 1206. A memory 1212, also shown in FIG. 12, is coupled to the encoder module 1204, to the code processing module 1210, to the post-encoding processing module 1214, and to the transmitter module 1206. Although not shown, the transmitter module 1206 could include a modulator, an amplifier, antenna and/or other modules or components of a transmit chain or alternatively could be configured to interface with a separate (RF) transmission module. For example, some of all of the modules 1204, 1206, 1210, 1212, 1214 of the apparatus 1200 may be implemented in hardware or circuitry (e.g. in one or more chipsets, microprocessors, ASICs, FPGAs, dedicated logic circuitry, or combinations thereof) so as to produce code words as described herein for transmission by a separate (RF) unit.

In some embodiments, the memory 1212 is a non-transitory computer readable medium at 1212, that includes instructions for execution by a processor to implement and/or control operation of the code processing module 1210, the encoder module 1204, the post-encoding processing module 1214, the transmitter module 1206 in FIG. 12, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1212.

In some embodiments, the encoder module 1204 is implemented in circuitry, such as a processor, that is configured to encode input bits as disclosed herein. In a processor-based implementation of the encoder module 1204, processor-executable instructions to configure a processor to perform encoding operations are stored in a non-transitory processor-readable medium. The non-transitory medium could include, in the memory 1212 for example, one or more solid-state memory devices and/or memory devices with movable and possibly removable storage media.

The code processing module 1210 could be implemented in circuitry that is configured to determine coding parameters such as mother code block length, and to determine an ordered sub-channel sequence as disclosed herein. In some embodiments, the code processing module 1210 is implemented using a processor. The same processor or other circuitry, or separate processors or circuitry, could be used to implement both the encoder module 1204 and the code processing module 1210. As noted above for the encoder module 1204, in a processor-based implementation of the code processing module 1210, processor-executable instructions to configure a processor to perform code processing operations are stored in a non-transitory processor-readable medium, in the memory 1212 for example.

Like the encoder module 1204 and the code processing module 1210, the post-encoding processing module 1214 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 1214, processor-executable instructions to configure a processor to perform post-encoding operations are stored in a non-transitory processor-readable medium, examples of which are described above. In an embodiment, the post-encoding processing module 1214 derives a puncturing or shortening scheme from a puncturing or shortening scheme that is to be applied to a code word prior to transmission. Information indicative of bit positions and/or sub-channels that are affected by post-encoding operations, or information from which such bit positions or sub-channels may be determined, may be fed back to the code processing module 1210, stored to the memory 1212, or otherwise made available to the code processing module 1210 by the post-encoding processing module 1214.

In some embodiments of the code processing module 1210, the coding parameters and/or the ordered sub-channel sequence may be determined based on information from the post-encoding processing module 1214. For instance, the ordered sub-channel sequence may be determined based on the rate-matching scheme determined by the post-encoding processing module 1214. Conversely, in some other embodiments, the post-encoding processing module 1214 may determine a rate-matching scheme based on the coding parameters and/or the ordered sub-channel sequence determined by the code processing module 1210. In yet some other embodiments, the determinations made within the code processing module 1210 and post-encoding processing module 1214 are jointly performed and optimized.

The apparatus 1200 could implement any of various other features that are disclosed herein. For example, the encoder module 1204, the transmitter module 1206, the code processing module 1210, and/or the post-encoding processing module 1214 could be configured to implement any one or more of the features listed or otherwise described above with reference to FIG. 10.

In some alternative embodiments, the functionality of the encoder module 1204, the transmitter module 1206, the code processing module 1210, and/or the post-encoding processing module 1214 described herein may be fully or partially implemented in hardware or alternatively in software, for example in modules stored in a memory such as 1212 and executed by one or more processors of the apparatus 1200.

An apparatus could therefore include a processor, and a memory such as 1212, coupled to the processor, storing instructions which, when executed by the processor, cause the processor to perform the functionality and/or embodiments described above in relation to the encoder module 1204, the transmitter module 1206, the code processing module 1210, and/or the post-encoding module 1214 described herein.

Figure 13:
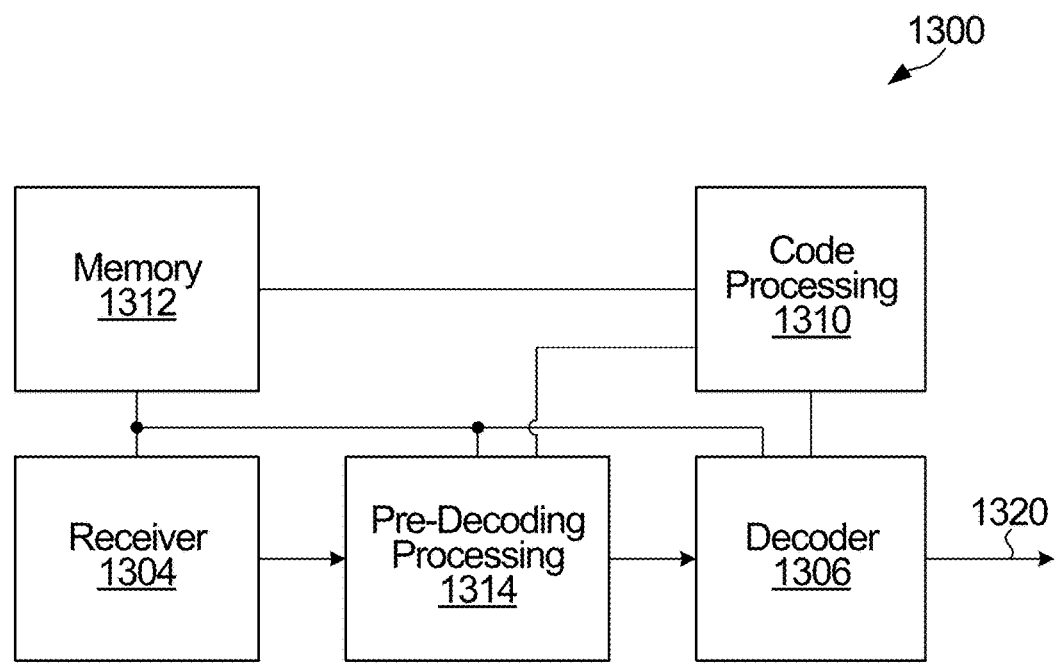
FIG. 13 is a block diagram of another example apparatus for receiving and decoding code words.

FIG. 13 is a block diagram of an example apparatus for receiving and decoding code words. The apparatus 1300 includes a receiver module 1304 which is configured to receive signals transmitted wirelessly and which is coupled to a decoder module 1306. The apparatus 1300 also includes a code processing module 1310 coupled to the decoder module 1306 and a pre-decoding processing module 1314. The pre-decoding processing module 1314 is also coupled to the decoder module 1306 and to the receiver module 1304. A memory 1312 also shown in FIG. 13, is coupled to the decoder module 1306, to the code processing module 1310, to the receiver module 1304, and to the pre-decoding processing module 1314.

Although not shown, the receiver module 1304 could include an antenna, demodulator, amplifier, and/or other modules or components of a receive chain or alternatively could be configured to interface with a separate (RF) receiving module. For example, some of all of the modules 1304, 1306, 1310, 1312, 1314 of the apparatus 1300 may be implemented in hardware or circuitry (e.g. in one or more chipsets, microprocessors, ASICs, FPGAs, dedicated logic circuitry, or combinations thereof) so as to receive a word based on a code word of a polar code as described herein. Decoded bits are output at 1320 for further receiver processing.

In some embodiments, the memory 1312 is a non-transitory computer readable medium that includes instructions for execution by a processor to implement and/or control operation of the receiver module 1304, decoder module 1306, the code processing module 1310, and the pre-decoding processing module 1314 in FIG. 13, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1312.

The decoder module 1306 is implemented in circuitry, such as a processor, that is configured to decode received code words as disclosed herein. In a processor-based implementation of the decoder module 1306, processor-executable instructions to configure a processor to perform decoding operations are stored in a non-transitory processor-readable medium. The non-transitory medium could include, in the memory 1312 for example, one or more solid-state memory devices and/or memory devices with movable and possibly removable storage media.

The code processing module 1310 is implemented in circuitry that is configured to determine (and store to the memory 1312) ordered sub-channel sequences as disclosed herein. In a processor-based implementation of the code-processing module 1310, processor-executable instructions to configure a processor to perform code-processing operations are stored in a non-transitory processor-readable medium, examples of which are described above. Information representing ordered sub-channel sequences, and/or the selected sub-channels could be provided to the decoder module 1306 by the code processing module 1310 for use in decoding received words, and/or stored in the memory 1312 by the code processing module 1310 for subsequent use by the decoder module 1306.

Like the decoder module 1306 and the code processing module 1310, the pre-decoding processing module 1314 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 1314, processor-executable instructions to configure a processor to perform pre-decoding processing operations are stored in a non-transitory processor-readable medium, examples of which are described above. In an embodiment, the pre-decoding processing module 1314 derives a puncturing or shortening scheme from a puncturing or shortening scheme that is to be applied to a received code word. Information indicative of bit positions and/or sub-channels that are affected by pre-decoding processing, or information from which such bit positions or sub-channels may be determined, may be fed back to the code processing module 1310, stored to the memory 1312, or otherwise made available to the code processing module 1310 by the pre-decoding processing module 1314.

In some embodiments of the code processing module 1310, the ordered sub-channel sequence may be determined based on information from the pre-decoding processing module 1314. For instance, the ordered sub-channel sequence may be determined based on the rate-matching scheme determined by the pre-decoding processing module 1314. Conversely, in some other embodiments, the pre-decoding processing module 1314 may determine a rate-matching scheme based on the coding parameters and/or the ordered sub-channel sequence determined by the code processing module 1310. In yet some other embodiments, the determinations made within the code processing module 1310 and pre-decoding processing module 1314 are jointly performed and optimized.

In some alternative embodiments, the functionality of the receiver module 1304, the decoder module 1306, the code processing module 1310, and/or the pre-decoding processing module 1314 described herein may be fully or partially implemented in software or modules, for example in receiving and decoding modules stored in a memory 1312 and executed by one or more processors of the apparatus 1300.

An apparatus could therefore include a processor, and a memory such as 1312, coupled to the processor, storing instructions which, when executed by the processor, cause the processor to perform the functionality and/or embodiments disclosed herein, or receiving/decoding operations corresponding to transmitting/encoding operations disclosed herein.

The apparatus 1300 could implement any of various other features that are disclosed herein. For example, the decoder module 1306, the receiver module 1304, the code processing module 1310, and/or the pre-decoding processing module 1314 could be configured to implement any one or more of receiving/decoding features corresponding to encoding/transmitting features noted above.

Figure 14:
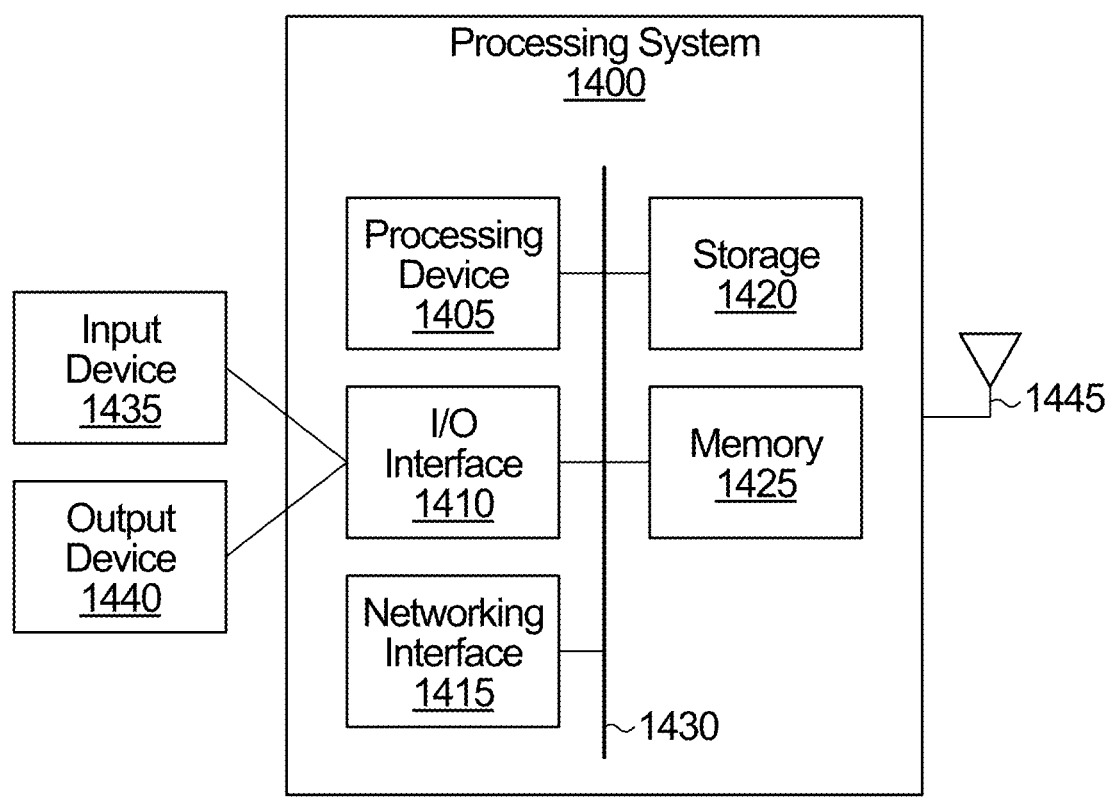
FIG. 14 is a block diagram of an example simplified processing system, which may be used to implement embodiments disclosed herein.

FIGS. 10 to 13 are generalized block diagrams of apparatus that could be used to implement embodiments disclosed herein. FIG. 14 is a block diagram of an example simplified processing system 1400, which may be used to implement embodiments disclosed herein, and provides a higher level implementation example. The apparatus 1000, the apparatus 1100, or both, may be implemented using the example processing system 1400, or variations of the processing system 1400. The processing system 1400 could be a server or a mobile device, for example, or any suitable processing system. Other processing systems suitable for implementing embodiments described in the present disclosure may be used, which may include components different from those discussed below. Although FIG. 14 shows a single instance of each component, there may be multiple instances of each component in the processing system 1400.

The processing system 1400 may include one or more processing devices 1405, such as a processor, a microprocessor, an ASIC, an FPGA, a dedicated logic circuitry, or combinations thereof. The processing system 1400 may also include one or more input/output (I/O) interfaces 1410, which may enable interfacing with one or more appropriate input devices 1435 and/or output devices 1440. The processing system 1400 may include one or more network interfaces 1415 for wired or wireless communication with a network (e.g., an intranet, the Internet, a P2P network, a WAN and/or a LAN) or other node. The network interfaces 1415 may include wired links (e.g., Ethernet cable) and/or wireless links (e.g., one or more antennas) for intra-network and/or inter-network communications. The network interfaces 1415 may provide wireless communication via one or more transmitters or transmit antennas and one or more receivers or receive antennas, for example. In this example, a single antenna 1445 is shown, which may serve as both transmitter and receiver. However, in other examples there may be separate antennas for transmitting and receiving. The processing system 1400 may also include one or more storage units 1420, which may include a mass storage unit such as a solid state drive, a hard disk drive, a magnetic disk drive and/or an optical disk drive.

The processing system 1400 may include one or more memories 1425, which may include a volatile or non-volatile memory (e.g., a flash memory, a random access memory (RAM), and/or a read-only memory (ROM)). The non-transitory memories 1425 may store instructions for execution by the processing devices 1405, such as to carry out examples described in the present disclosure. The memories 1425 may include other software instructions, such as for implementing an operating system and other applications/functions. In some examples, one or more data sets and/or modules may be provided by an external memory (e.g., an external drive in wired or wireless communication with the processing system 1400) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 1430 providing communication among components of the processing system 1400. The bus 1430 may be any suitable bus architecture including, for example, a memory bus, a peripheral bus or a video bus. In FIG. 14, the input devices 1435 (e.g., a keyboard, a mouse, a microphone, a touchscreen, and/or a keypad) and output devices 1440 (e.g., a display, a speaker and/or a printer) are shown as external to the processing system 1400. In other examples, one or more of the input devices 1435 and/or the output devices 1440 may be included as a component of the processing system 1400.

Figure 15:
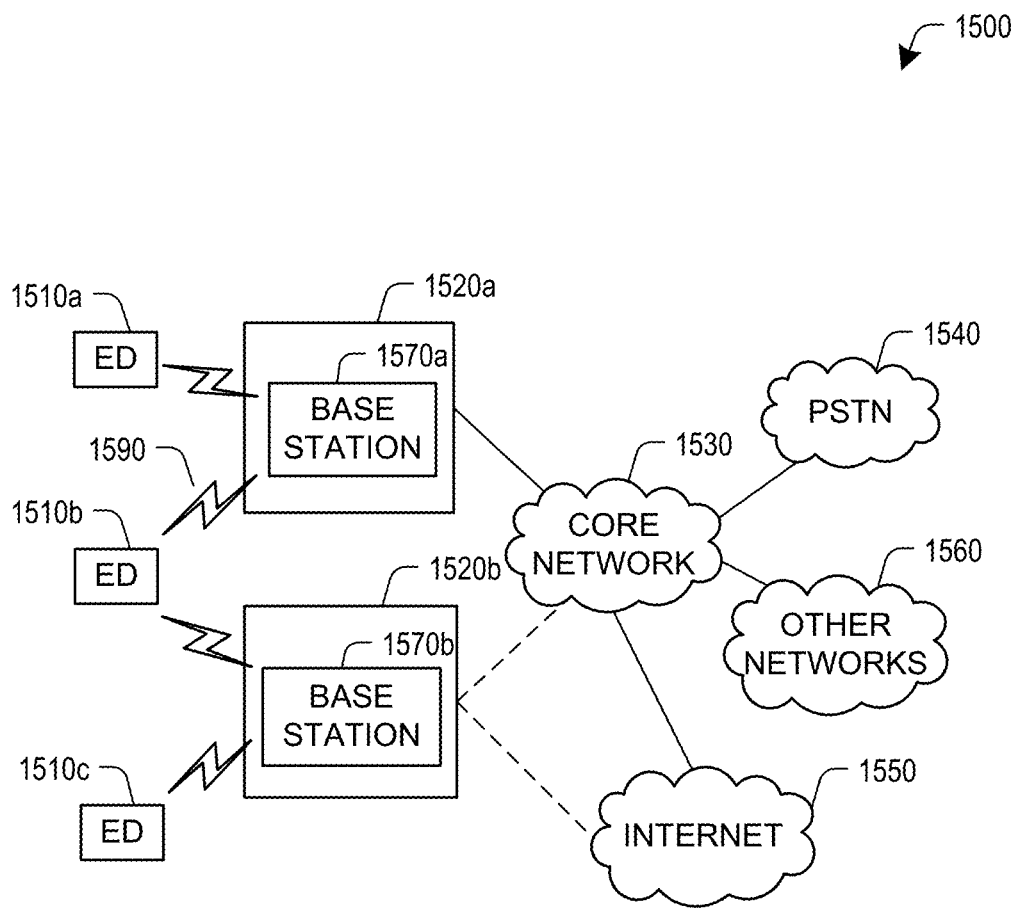
FIG. 15 illustrates an example communication system in which embodiments of the present disclosure could be implemented.

FIG. 15 illustrates an example communication system 1500 in which embodiments of the present disclosure could be implemented. In general, the communication system 1500 enables multiple wireless or wired elements to communicate data and other content. The purpose of the communication system 1500 may be to provide content (voice, data, video, text) via broadcast, narrowcast, user device to user device, etc. The communication system 1500 may operate by sharing resources such as bandwidth.

In this example, the communication system 1500 includes electronic devices (ED) 1510a-1510c, radio access networks (RANs) 1520a-1520b, a core network 1530, a public switched telephone network (PSTN) 1540, the internet 1550, and other networks 1560. Although certain numbers of these components or elements are shown in FIG. 15, any reasonable number of these components or elements may be included.

The EDs 1510a-1510c and base stations 1570a-1570b are examples of communication equipment that can be configured to implement some or all of the functionality and/or embodiments described herein. For example, any one of the EDs 1510a-1510c and base stations 1570a-1570b could be configured to implement the encoding or decoding functionality (or both) described above. In another example, any one of the EDs 1510a-1510c and base stations 1570a-1570b could include an apparatus 1600 (FIG. 16) or 1800 (FIG. 18), an apparatus 1700 (FIG. 17) or 1900 (FIG. 19), or both.

The EDs 1510a-1510c are configured to operate, communicate, or both, in the communication system 1500. For example, the EDs 1510a-1510c are configured to transmit, receive, or both via wireless or wired communication channels. Each ED 1510a-1510c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 15, the RANs 1520a-1520b include base stations 1570a-1570b, respectively. Each base station 1570a-1570b is configured to wirelessly interface with one or more of the EDs 1510a-1510c to enable access to any other base station 1570a-1570b, the core network 1530, the PSTN 1540, the Internet 1550, and/or the other networks 1560. For example, the base stations 1570a-1570b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 1510a-1510c may be alternatively or additionally configured to interface, access, or communicate with any other base station 1570a-1570b, the internet 1550, the core network 1530, the PSTN 1540, the other networks 1560, or any combination of the preceding. The communication system 1500 may include RANs, such as RAN 1520b, wherein the corresponding base station 1570b accesses the core network 1530 via the internet 1550, as shown.

The EDs 1510a-1510c and base stations 1570a-1570b are examples of communication equipment that can be configured to implement some or all of the functionality and/or embodiments described herein. In the embodiment shown in FIG. 15, the base station 1570a forms part of the RAN 1520a, which may include other base stations, base station controller(s) (BSC), radio network controller(s) (RNC), relay nodes, elements, and/or devices. Any base station 1570a, 1570b may be a single element, as shown, or multiple elements, distributed in the corresponding RAN, or otherwise. Also, the base station 1570b forms part of the RAN 1520b, which may include other base stations, elements, and/or devices. Each base station 1570a-1570b transmits and/or receives wireless signals within a particular geographic region or area, sometimes referred to as a "cell" or "coverage area". A cell may be further divided into cell sectors, and a base station 1570a-1570b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 1520a-1520b shown is exemplary only. Any number of RAN may be contemplated when devising the communication system 1500.

The base stations 1570*a*-1570*b* communicate with one or more of the EDs 1510*a*-1510*c* over one or more air interfaces 1590 using wireless communication links e.g. RF, microwave, infrared (IR), etc. The air interfaces 1590 may utilize any suitable radio access technology. For example, the communication system 1500 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1590.

A base station 1570*a*-1570*b* may implement Universal Mobile Telecommunication System (UMTS) Terrestrial Radio Access (UTRA) to establish an air interface 1590 using wideband CDMA (WCDMA). In doing so, the base station 1570*a*-1570*b* may implement protocols such as HSPA, HSPA+ optionally including HSDPA, HSUPA or both. Alternatively, a base station 1570*a*-1570*b* may establish an air interface 1590 with Evolved UTMS Terrestrial Radio Access (E-UTRA) using LTE, LTE-A, and/or LTE-B. It is contemplated that the communication system 1500 may use multiple channel access functionality, including such schemes as described above. Other radio technologies for implementing air interfaces include IEEE 802.11, 802.15, 802.16, CDMA2000, CDMA2000 1×, CDMA2000 EV-DO, IS-2000, IS-95, IS-856, GSM, EDGE, and GERAN. Of course, other multiple access schemes and wireless protocols may be utilized.

The RANs 1520*a*-1520*b* are in communication with the core network 1530 to provide the EDs 1510*a*-1510*c* with various services such as voice, data, and other services. The RANs 1520*a*-1520*b* and/or the core network 1530 may be in direct or indirect communication with one or more other RANs (not shown), which may or may not be directly served by core network 1530, and may or may not employ the same radio access technology as RAN 1520*a*, RAN 1520*b* or both. The core network 1530 may also serve as a gateway access between (i) the RANs 1520*a*-1520*b* or EDs 1510*a*-1510*c* or both, and (ii) other networks (such as the PSTN 1540, the internet 1550, and the other networks 1560). In addition, some or all of the EDs 1510*a*-1510*c* may include functionality for communicating with different wireless networks over different wireless links using different wireless technologies and/or protocols. Instead of wireless communication (or in addition thereto), the EDs 1510*a*-1510*c* may communicate via wired communication channels to a service provider or switch (not shown), and to the internet 1550. PSTN 1540 may include circuit switched telephone networks for providing plain old telephone service (POTS). Internet 1550 may include a network of computers and subnets (intranets) or both, and incorporate protocols, such as IP, TCP, UDP. EDs 1510*a*-1510*c* may be multimode devices capable of operation according to multiple radio access technologies, and incorporate multiple transceivers necessary to support such.

Figure 16A:
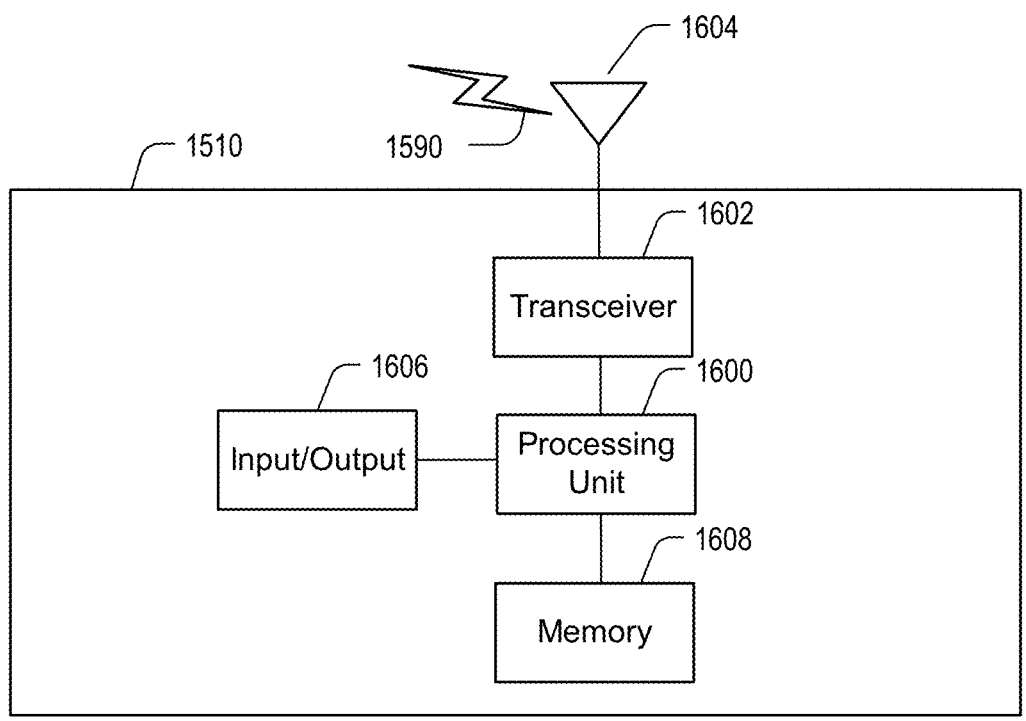
FIGS. 16A and 16B illustrate example devices that may implement the methods and teachings according to this disclosure.
Figure 16B:
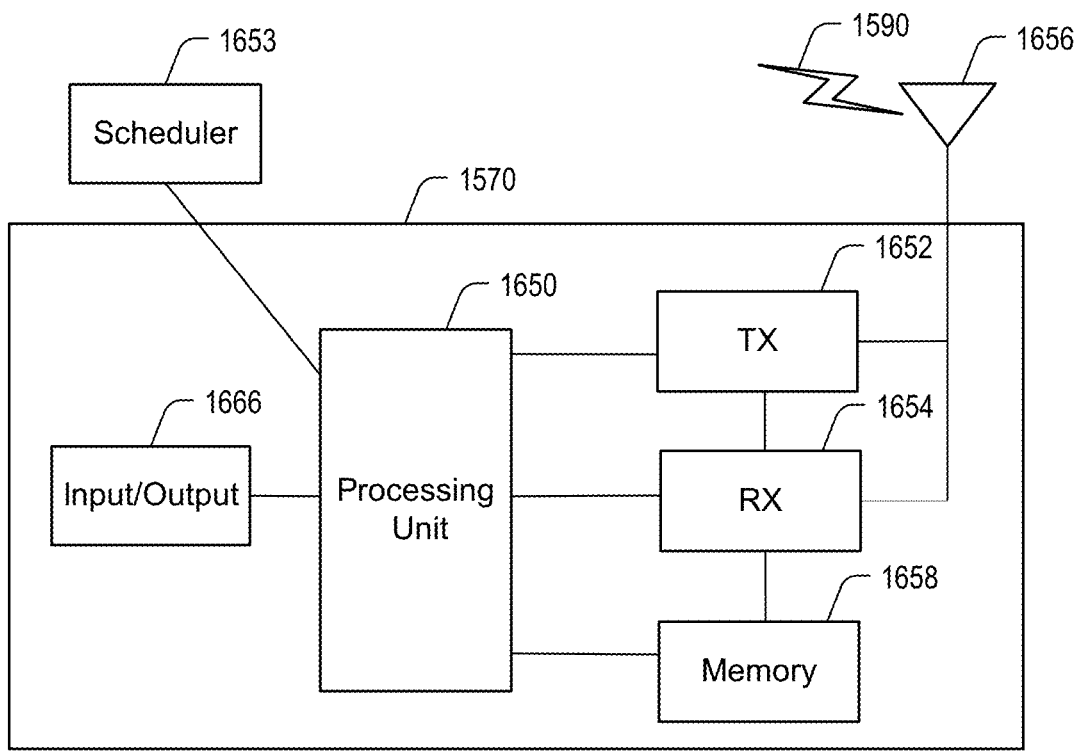

FIGS. 16A and 16B illustrate example devices that may implement the methods and teachings according to this disclosure. In particular, FIG. 16A illustrates an example ED 1510, and FIG. 16B illustrates an example base station 1570. These components could be used in the communication system 1500 or in any other suitable system.

As shown in FIG. 16A, the ED 1510 includes at least one processing unit 1600. The processing unit 1600 implements various processing operations of the ED 1510. For example, the processing unit 1600 could perform signal coding, data processing, power control, input/output processing, or any other functionality enabling the ED 1510 to operate in the communication system 1500. The processing unit 1600 may also be configured to implement some or all of the functionality and/or embodiments described in more detail above. Each processing unit 1600 includes any suitable processing or computing device configured to perform one or more operations. Each processing unit 1600 could, for example, include a microprocessor, microcontroller, digital signal processor, field programmable gate array, or application specific integrated circuit.

The ED 1510 also includes at least one transceiver 1602. The transceiver 1602 is configured to modulate data or other content for transmission by at least one antenna or Network Interface Controller (NIC) 1604. The transceiver 1602 is also configured to demodulate data or other content received by the at least one antenna 1604. Each transceiver 1602 includes any suitable structure for generating signals for wireless or wired transmission and/or processing signals received wirelessly or by wire. Each antenna 1604 includes any suitable structure for transmitting and/or receiving wireless or wired signals. One or multiple transceivers 1602 could be used in the ED 1510, and one or multiple antennas 1604 could be used in the ED 1510. Although shown as a single functional unit, a transceiver 1602 could also be implemented using at least one transmitter and at least one separate receiver.

The ED 1510 further includes one or more input/output devices 1606 or interfaces (such as a wired interface to the internet 1550). The input/output devices 1606 permit interaction with a user or other devices in the network. Each input/output device 1606 includes any suitable structure for providing information to or receiving information from a user, such as a speaker, microphone, keypad, keyboard, display, or touch screen, including network interface communications.

In addition, the ED 1510 includes at least one memory 1608. The memory 1608 stores instructions and data used, generated, or collected by the ED 1510. For example, the memory 1608 could store software instructions or modules configured to implement some or all of the functionality and/or embodiments described above and that are executed by the processing unit(s) 1600. Each memory 1608 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 16B, the base station 1570 includes at least one processing unit 1650, at least one transmitter 1652, at least one receiver 1654, one or more antennas 1656, at least one memory 1658, and one or more input/output devices or interfaces 1666. A transceiver, not shown, may be used instead of the transmitter 1652 and receiver 1654. A scheduler 1653 may be coupled to the processing unit 1650. The scheduler 1653 may be included within or operated separately from the base station 1570. The processing unit 1650 implements various processing operations of the base station 1570, such as signal coding, data processing, power control, input/output processing, or any other functionality. The processing unit 1650 can also be configured to implement some or all of the functionality and/or embodiments described in more detail above. Each processing unit 1650 includes any suitable processing or computing device configured to perform one or more operations. Each processing unit 1650 could, for example, include a microprocessor, microcontroller, digital signal processor, field programmable gate array, or application specific integrated circuit.

Each transmitter 1652 includes any suitable structure for generating signals for wireless or wired transmission to one or more EDs or other devices. Each receiver 1654 includes any suitable structure for processing signals received wirelessly or by wire from one or more EDs or other devices. Although shown as separate components, at least one transmitter 1652 and at least one receiver 1654 could be combined into a transceiver. Each antenna 1656 includes any suitable structure for transmitting and/or receiving wireless or wired signals. Although a common antenna 1656 is shown here as being coupled to both the transmitter 1652 and the receiver 1654, one or more antennas 1656 could be coupled to the transmitter(s) 1652, and one or more separate antennas 1656 could be coupled to the receiver(s) 1654. Each memory 1658 includes any suitable volatile and/or non-volatile storage and retrieval device(s) such as those described above in connection to the ED 1510. The memory 1658 stores instructions and data used, generated, or collected by the base station 1570. For example, the memory 1658 could store software instructions or modules configured to implement some or all of the functionality and/or embodiments described above and that are executed by the processing unit(s) 1650.

Each input/output device 1666 permits interaction with a user or other devices in the network. Each input/output device 1666 includes any suitable structure for providing information to or receiving/providing information from a user, including network interface communications.

The embodiments described with reference to FIGS. 10 to 16B relate to example apparatus. Method embodiments, for decoding and/or encoding, are also contemplated.

Figure 17:
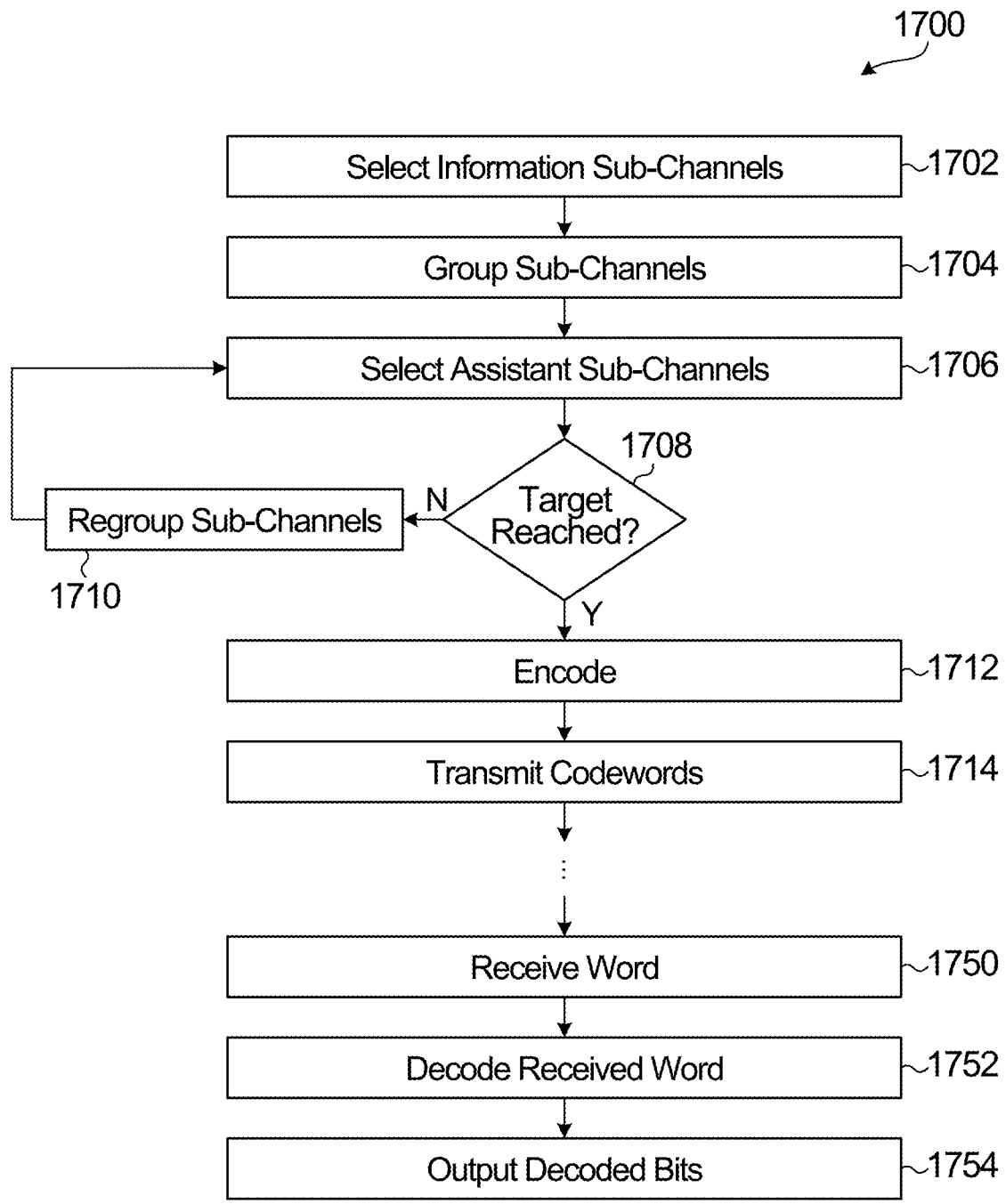
FIG. 17 is a flow diagram of an example coding method according to another embodiment.

FIG. 17 is a flow diagram of an example coding method according to another embodiment. The illustrated example method 1700 includes selecting information sub-channels at 1702. This might apply to embodiments in which assistant sub-channels are selected from among information sub-channels, but is optional and need not be performed before assistant sub-channel selection in all embodiments. Assistant sub-channel selection is shown at 1706, and in an embodiment this involves selecting, from each of a plurality of non-adjacent segments that each comprise a subset of sub-channels that are defined by a code and have associated reliabilities of correct decoding of input bits at input bit positions an assistant sub-channel to carry a decoding assistant bit in input bits that are to be encoded. In some embodiments, the sub-channels in each segment are consecutive. Sub-channel selection could be based on the reliabilities, for example. Some embodiments also involve grouping sub-channels into the segments, as shown at 1704. After a target number of assistant sub-channels have been selected, as determined at 1708, the input bits are encoded with the code at 1712 to generate code words. The code words are then transmitted at 1714.

Returning to block 1708, which involves determining whether a target number of assistant sub-channels have been selected, in the event of a negative determination one or more further assistant sub-channels are selected. This involves selecting at 1706, from each of non-adjacent segments of a plurality of regrouped segments that each comprise a number of sub-channels, which are consecutive sub-channels in some embodiments, that is different from a number of sub-channels in the segments, a further assistant sub-channel to carry a decoding assistant bit in the input bits. Sub-channel selection could be based on the sub-channel reliabilities, for example. In some embodiments, a method also involves regrouping the sub-channels into the regrouped segments, as shown at 1710.

FIG. 17 also shows example operations that are performed at a receiver/decoder. A word that is based on a code word of a polar code is received at 1750 and decoded at 1752, and decoded bits are output at 1754. The decoding could use assistant bits as disclosed herein.

The example method in FIG. 17 is intended for illustrative purposes. Other embodiments could involve performing the illustrated operations in any of various ways, performing fewer or additional operations, and/or varying the order in which operations are performed.

In some embodiments, a method for encoding and transmitting input bits in a manner consistent with FIG. 17 involves selecting, from each of a plurality of non-adjacent segments that each comprise a subset of sub-channels with associated reliabilities, an assistant sub-channel to carry a decoding assistant bit in the input bits that are to be encoded; encoding the input bits to generate a code word; and transmitting the code word.

Other variations could be or become apparent to a skilled person based on the present disclosure.

For example, any one or more of the following could be provided, alone or in any of various combinations, in embodiments:

grouping the sub-channels into the segments;

determining whether a target number of assistant sub-channels have been selected, and if not, selecting, from each of non-adjacent segments of a plurality of regrouped segments that each comprise a number of, possibly consecutive, sub-channels that is different from a number of sub-channels in the segments, a further assistant sub-channel to carry a further decoding assistant bit in the input bits;

regrouping the sub-channels into the regrouped segments;

the regrouping comprises combining multiple adjacent segments into the regrouped segments;

the combining comprises combining pairs of adjacent segments into the regrouped segments;

the segments include the same number of sub-channels, which may or may not be consecutive sub-channels;

the decoding assistant bits are for error detection or path selection in a decoder;

the decoding assistant bits comprise one or more of: parity check, checksum, and CRC bits;

the method further comprises generating the decoding assistant bits;

the generating comprises generating the assistant bits in a manner consistent with example 1 or example 2 described above;

the method further comprises selecting information sub-channels to carry information bits in the input bits and frozen sub-channels to carry frozen bits in the input bits;

selecting an assistant sub-channel comprises selecting the assistant sub-channel from among the information sub-channels in each non-adjacent segment.

In another embodiment, a non-transitory processor-readable medium stores instructions which, when executed by one or more processors, cause the one or more processors to perform a method as disclosed herein.

Figure 18:
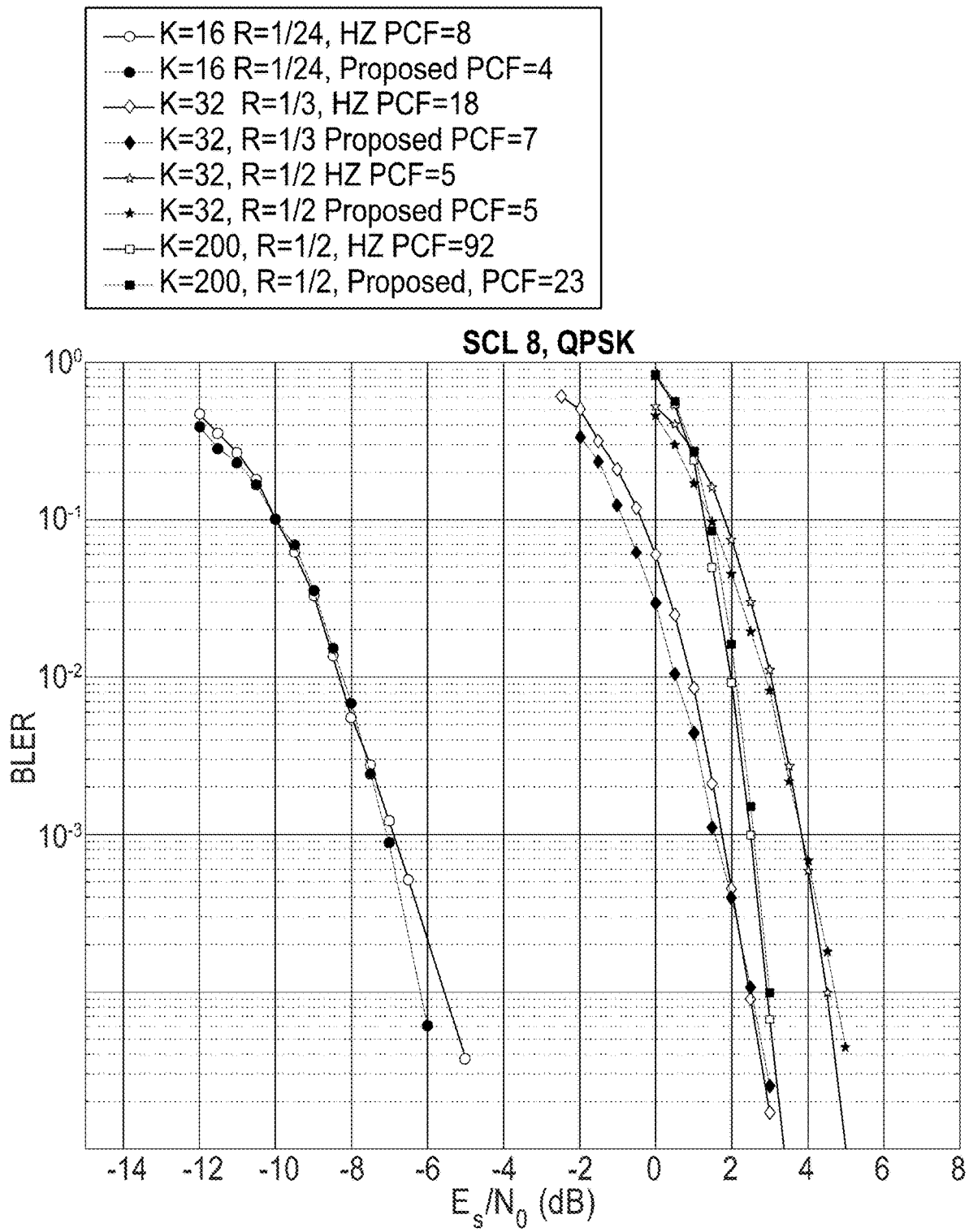
FIG. 18 is an example performance plot.

For the purposes of performance simulation, a shortening/puncturing scheme as proposed in [1] was used. FIG. 18 is an example performance plot, and provides performance comparisons between "HZ" PC-polar coding in accordance with an embodiment in [1] and "Proposed" embodiments consistent with the present disclosure. As can be seen, for three of the simulation cases, the "Proposed" embodiments result in up to 0.5 dB coding gain while reducing the number of assistant (PCF) bits significantly. In the case of K=200, the "Proposed" embodiment has small coding loss (around 0.05 dB) while significantly reducing the number of PC bits (by 75%). The "Proposed" embodiments could also be used to adjust the number of assistant bits to any arbitrary value, which in turn provides for adjusting decoding complexity to a desired level.

The simulations from which the example performance plot in FIG. 18 was derived were under the simulation conditions listed in the plot. Similar or different results may be observed in other simulations or actual implementations.

Embodiments disclosed herein could provide for high parallelism in assistant sub-channel selection, with a nested sub-channel selection technique that could be applied in conjunction with any polarization metric that is nested. The number of assistant bits could be significantly reduced relative to other coding techniques, because the number of assistant bits may be arbitrarily determined and a code may be designed based on the selected number of assistant bits. Performance could be at least comparable to performance of other techniques, but possibly lower sub-channel selection latency and/or fewer assistant bits.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is transmitted encoded each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

As noted above, polar codes have been selected for uplink and downlink eMBB control channel coding for the new 5G air interface, also known as the new 5G NR. The techniques disclosed herein could be used to encode not only control data over a control channel (e.g. PDCCH) but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

Additional example embodiments are also described below.

In some embodiments, assistant sub-channels for carrying assistant bits to assist in decoding of encoded information are selected from among sub-channels that are defined by a code and have associated reliabilities of correct decoding of input bits at input bit positions during encoding. An assistant sub-channel is selected from each of a plurality of non-adjacent segments that each comprise a subset of consecutive sub-channels, based on the associated reliabilities of the sub-channels. Some embodiments also involve grouping sub-channels into the segments. After a target number of assistant sub-channels have been selected, input bits are encoded with the code to generate code words, and the code words are transmitted. Assistant sub-channel selection could involve iterations to select assistant sub-channels at each iteration, until at least the target number of assistant sub-channels have been selected.

The invention claimed is:

1. An apparatus for encoding and transmitting input bits comprising:
    a sub-channel selector to select, from each of a first plurality of non-adjacent segments that each comprise a subset of adjacent sub-channels with associated reliabilities, an assistant sub-channel to carry a decoding assistant bit in the input bits;
    an encoder coupled to the sub-channel selector to encode the input bits to generate a codeword; and
    a transmitter, coupled to the encoder, to transmit the codeword generated by the encoder.

2. The apparatus of claim 1, wherein the sub-channel selector is further configured to group the adjacent sub-channels into the non-adjacent segments.

3. The apparatus of claim 1, wherein the sub-channel selector is further configured to determine whether a target number of assistant sub-channels have been selected, and if not, to select, from each of one or more non-adjacent regrouped segments of a plurality of regrouped segments that each comprise a number of adjacent sub-channels that is different from a number of sub-channels in each of the first plurality of non-adjacent segments, a further assistant sub-channel to carry a further decoding assistant bit in the input bits.

4. The apparatus of claim 3, wherein the sub-channel selector is further configured to regroup the sub-channels into the regrouped segments.

5. The apparatus of claim 4, wherein the sub-channel selector is configured to regroup the sub-channels into the regrouped segments by combining multiple adjacent segments into the regrouped segments.

6. The apparatus of claim 5, wherein the sub-channel selector is configured to combine pairs of adjacent segments into the regrouped segments.

7. The apparatus of claim 1, wherein the non-adjacent segments each include the same number of adjacent sub-channels.

8. The apparatus of claim 1, wherein the decoding assistant bits are for error detection or path selection in a decoder.

9. The apparatus of claim 1, wherein the decoding assistant bits comprise one or more of: parity check, checksum, and cyclic redundancy check (CRC) bits.

10. The apparatus of claim 1, further comprising:
    an assistant bit generator to generate the decoding assistant bits.

11. The apparatus of claim 1, wherein the sub-channel selector is further configured to select information sub-channels to carry information bits in the input bits and frozen sub-channels to carry frozen bits in the input bits, and to select the assistant sub-channels from among the information sub-channels in each non-adjacent segment.

12. A method for encoding and transmitting input bits comprising:
    selecting, from each of a first plurality of non-adjacent segments that each comprise a subset of adjacent sub-channels with associated reliabilities, an assistant sub-channel to carry a decoding assistant bit in the input bits that are to be encoded;
    encoding the input bits to generate a codeword; and
    transmitting the codeword.

13. The method of claim 12, further comprising:
    grouping the adjacent sub-channels into the non-adjacent segments.

14. The method of claim 12, further comprising:
    determining whether a target number of assistant sub-channels have been selected; and
    if not:
        selecting, from each of one or more non-adjacent regrouped segments of a plurality of regrouped segments that each comprise a number of adjacent sub-channels that is different from a number of sub-channels in each of the first plurality of non-adjacent segments, a further assistant sub-channel to carry a further decoding assistant bit in the input bits.

15. The method of claim 14, further comprising:
    regrouping the sub-channels into the regrouped segments.

16. The method of claim 15, wherein the regrouping comprises combining multiple adjacent segments into the regrouped segments.

17. The method of claim 16, wherein the combining comprises combining pairs of adjacent segments into the regrouped segments.

18. The method of claim 12, wherein the non-adjacent segments each include the same number of adjacent sub-channels.

19. The method of claim 12, wherein the decoding assistant bits are for error detection or path selection in a decoder.

20. The method of claim 12, wherein the decoding assistant bits comprise one or more of: parity check, checksum, and cyclic redundancy check (CRC) bits.

21. The method of claim 12, further comprising:
    generating the decoding assistant bits.

22. The method of claim 12, further comprising:
    selecting information sub-channels to carry information bits in the input bits and frozen sub-channels to carry frozen bits in the input bits,
    wherein selecting an assistant sub-channel comprises selecting the assistant sub-channel from among the information sub-channels in each non-adjacent segment.

23. User equipment comprising the apparatus of claim 1.

24. Communication network equipment comprising the apparatus of claim 1.

25. A non-transitory processor-readable medium storing instructions which, when executed by one or more processors, cause the one or more processors to perform a method, the method comprising:
    selecting, from each of a first plurality of non-adjacent segments that each comprise a subset of adjacent sub-channels with associated reliabilities, an assistant sub-channel to carry a decoding assistant bit in input bits that are to be encoded;
    encoding the input bits to generate a codeword; and
    transmitting the codeword.

* * * * *